United States Patent
Huang et al.

(10) Patent No.: US 11,319,410 B2
(45) Date of Patent: *May 3, 2022

(54) PRECURSOR FOR POLYIMIDE AND USE THEREOF

(71) Applicant: ETERNAL MATERIALS CO., LTD., Kaohsiung (TW)

(72) Inventors: Po-Yu Huang, Kaohsiung (TW); Chung-Jen Wu, Kaohsiung (TW); Meng-Yen Chou, Kaohsiung (TW); Chang-Hong Ho, Kaohsiung (TW); Shun-Jen Chiang, Kaohsiung (TW); Chung-Kai Cheng, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 178 days.

This patent is subject to a terminal disclaimer.

(21) Appl. No.: 15/867,942

(22) Filed: Jan. 11, 2018

(65) Prior Publication Data
US 2018/0194899 A1    Jul. 12, 2018

(30) Foreign Application Priority Data
Jan. 11, 2017    (TW) ................. 106101060

(51) Int. Cl.
| C08G 73/12 | (2006.01) |
| G03F 7/004 | (2006.01) |
| C09D 179/08 | (2006.01) |
| C08G 73/10 | (2006.01) |
| G03F 7/038 | (2006.01) |

(52) U.S. Cl.
CPC ........... *C08G 73/12* (2013.01); *C08G 73/101* (2013.01); *C08G 73/105* (2013.01); *C08G 73/1071* (2013.01); *C09D 179/08* (2013.01); *G03F 7/0045* (2013.01); *G03F 7/0046* (2013.01); *G03F 7/0387* (2013.01)

(58) Field of Classification Search
CPC .... G03F 7/0387; G03F 7/0046; G03F 7/0045; G03F 7/004; C08G 73/101; C08G 73/12; C08G 73/1071; C08G 73/105; C08G 73/127; C08G 73/126; C08G 73/1007; C09D 179/08
See application file for complete search history.

(56) References Cited

U.S. PATENT DOCUMENTS

| 3,652,500 | A | * | 3/1972 | Peterson | ............ | C08G 73/1028 |
| | | | | | | 528/229 |
| 3,993,630 | A | | 11/1976 | Darmory et al. | | |
| 4,108,836 | A | * | 8/1978 | Bilow | .................. | C08G 73/101 |
| | | | | | | 428/435 |
| 5,066,646 | A | * | 11/1991 | Driver | ..................... | A61P 31/04 |
| | | | | | | 514/31 |
| 5,171,828 | A | * | 12/1992 | Meterko et al. | ... | C08G 73/1042 |
| | | | | | | 257/E23.007 |
| 5,350,663 | A | * | 9/1994 | Blum | .................... | C08G 73/101 |
| | | | | | | 430/283.1 |
| 2008/0058476 | A1 | * | 3/2008 | Whiteker | ............... | C08G 73/10 |
| | | | | | | 525/418 |
| 2008/0096997 | A1 | | 4/2008 | Wu et al. | | |

(Continued)

FOREIGN PATENT DOCUMENTS

| CN | 1022199001 A | 10/2006 |
| EP | 1376231 A1 | 1/2004 |

(Continued)

OTHER PUBLICATIONS

"oligomer molecule", PAC, 1996, 68, 2287 (Glossary of basic terms in polymer science (IUPAC recommendations 1996)) on p. 2289. (Year: 1996).*

(Continued)

*Primary Examiner* — Peter L Vajda
*Assistant Examiner* — Nicholas E Brown
(74) *Attorney, Agent, or Firm* — Ladas & Parry LLP

(57) ABSTRACT

The present invention provides an amic acid ester oligomer having a structure of Formula (1) or (1'):

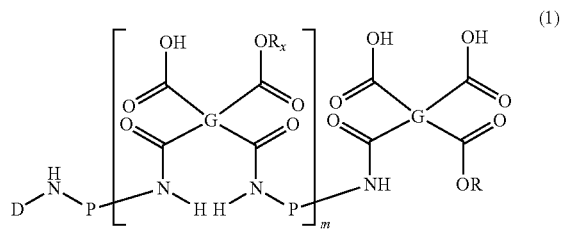

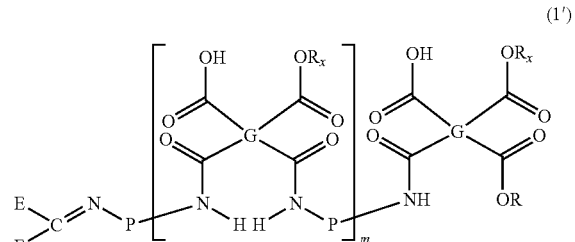

wherein G, P, R, $R_x$, D, E and m are those as defined in the specification. The present invention also provides a polyimide precursor composition or a photosensitive polyimide precursor composition comprising the amic acid ester oligomer, as well as a polyimide prepared from the composition.

18 Claims, No Drawings

(56) References Cited

U.S. PATENT DOCUMENTS

| | | |
|---|---|---|
| 2010/0168265 A1 | 7/2010 | Wu et al. |
| 2013/0172494 A1 | 7/2013 | Cheng et al. |
| 2013/0184406 A1 | 7/2013 | Miyazaki et al. |

FOREIGN PATENT DOCUMENTS

| | | | | |
|---|---|---|---|---|
| EP | 2865702 A1 | | 4/2015 | |
| GB | 1560869 A | * | 2/1980 | ......... C08G 73/1007 |
| JP | 2007058017 A | * | 3/2007 | |
| JP | 2009109589 A | * | 5/2009 | |
| KR | 20140047105 A | * | 4/2014 | ............. G03F 7/039 |
| WO | 9406057 | | 3/1994 | |

OTHER PUBLICATIONS

Tundo et al, "The Chemistry of Dimethyl Carbonate", ACC. Chem. Res. 2002, 35, pp. 706-716. (Year: 2002).*
English translation of KR 20140047105 A with publication date of Apr. 21, 2014. (this citation is added by the examiner in view of no copy of actual foreign document cited but translation was submitted /ch/ Feb. 29, 2020).
Japanese Office Action dated Oct. 5, 2018 issued in corresponding Japanese Patent Application No. 2018-002496 with an English translation thereof.
Computer generated English translation of JP2009109589.
Computer generated English translation of JP2007058017.

* cited by examiner

PRECURSOR FOR POLYIMIDE AND USE THEREOF

BACKGROUND OF THE INVENTION

1. Field of the Invention

The present invention relates to a polyimide (PI) precursor, and also to use of the precursor in the preparation of PI.

2. Description of the Related Art

Since polyimides possess excellent thermal stability and good mechanical, electrical, and chemical properties, they have been used as high performance polymers. Polyimides are quite important in the applications to the integrated to circuit industry, electronic packaging, enamelled wires, printed circuit boards, sensing elements, separating films, and structural materials, and play the part of critical materials.

Polyimides are typically synthesized by a two-stage polymerization and condensation reaction. Normally, in the first stage, a diamine monomer is dissolved in a polar aprotic solvent, such as N-methylpyrrolidone (NMP), N,N-dimethylacetamide (DMAC), dimethylformamide (DMF), or dimethyl sulfoxide (DMSO). An equivalent of a dianhydride monomer is then added. Afterwards, the condensation reaction is conducted at a low temperature or room temperature to form a precursor for the polyimide, i.e., poly(amic acid) (PAA). In the second stage, a thermal imidization or chemical imidization is carried out in order to achieve a condensation, dehydration, and cyclization reaction so as to convert the poly(amic acid) into polyimide. The reaction scheme for preparing polyimides can be briefly described as follows:

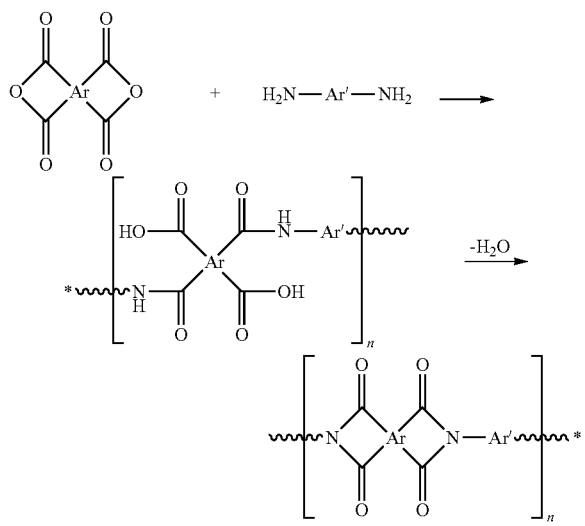

In the above preparation method, if the molecular weight of the poly(amic acid) obtained in the first stage does not reach a certain standard (i.e., it is overly low), a polyimide film with good physical properties cannot be obtained after imidization. However, if the poly(amic acid) obtained in the first stage is overly high in molecular weight, its viscosity will be too high and its operability will become poor. In addition, poor leveling occurs easily in the coating step. Moreover, if the poly(amic acid) is overly high in molecular weight, an extremely strong internal stress is produced due to the interaction between molecules and the shortening of molecular chains in the imidization of the second stage. The strong internal stress causes the coated substrate to bend and deform.

Taiwan Patent Application No. 096128743 discloses an amic acid ester oligomer useful as a polyimide precursor. The amic acid ester oligomer has an amino group at one end, and both an ester group (—COOR) and a carboxyl group as terminal groups at the other end, and is in a meta-stable status. However, in long-term storage, a few amino groups in numerous molecules of the amic acid ester oligomer react with the terminal groups at the other end (that is, the ester group (—COOR) and the carboxyl group (—COOH)), causing an elevated viscosity and thus poor operability. Moreover, the terminal amino group of the amic acid ester oligomer is prone to react with a dehydrating agent, and thus not applicable to chemical imidization (low-temperature cyclization), and can only be restricted to the conventional imidization by heating at a high temperature (high-temperature cyclization). Furthermore, upon thermal imidization, 100% imidization generally can be realized only by continuously heating at a high temperature of 300° C. for several hours. This process is time consuming and easily brings safety problems during operation. In addition, when the product has a side chain with low bond energy, the side chain will often be destroyed before cyclization in the high temperature environment.

Photosensitive polyimide (PSPI) is imparted with photosensitivity by introducing a photosensitive group to the structure of polyimide or a precursor thereof, whereby the polyimide not only retains the original excellent mechanical and electrical properties, but also has a photosensitive feature. In the manufacturing process of semiconductors, photosensitive polyimide is used in place of the previous photoresist. Thus, the process steps are simplified, which contributes to the improvement of the yield and the reduction of the cost.

An acryloyloxy group-containing photosensitive polyimide is known in the art. However, such group affects the desired properties of polyimide. Therefore, it needs to be removed after exposure. Nevertheless, compounds containing acryloyloxy group typically have a boiling point of up to 250° C. If such photosensitive polyimides are used in the manufacturing process of semiconductors, a higher hardbake temperature is required.

U.S. Pat. No. 6,605,353 discloses an epoxy-modified photosensitive polyimide. However, since the polymer is obtained by reacting an epoxide with an acid, the reactivity is poor. Moreover, the OH functional group produced after the ring opening may react with the epoxy group, and therefore, the problems of lacking stability and thermal stability exist.

In view of this, the present invention is directed to research results made for the above-mentioned problems. The present inventors found a new amic acid ester oligomer, which not only has the advantages of low molecular weight, high coatability and storage stability, but also can carry out cyclodehydration at a low temperature, to prepare a polyimide with excellent mechanical and electrical properties. In addition, the amic acid ester oligomer of the present invention has a particular design of the structure and can be directly applied to an exposure and developing process in the absence of an acryloyloxy group. Therefore, there is no problem with respect to affecting physical properties of the polyimide by the residues of acryloyloxy groups.

SUMMARY OF THE INVENTION

An object of the present invention is to provide a new amic acid ester oligomer, which is not only applicable to a thermal imidization process, but also to a chemical imidization process.

Another object of the present invention is to provide a polyimide precursor composition comprising the amic acid ester oligomer.

Another object of the present invention is to provide a photosensitive polyimide precursor composition comprising the amic acid ester oligomer.

A further object of the present invention is to provide a polyimide, which is prepared from the foregoing amic acid ester oligomer or precursor composition.

PREFERRED EMBODIMENT OF THE PRESENT INVENTION

In the present invention, the term "alkyl" refers to linear or branched saturated hydrocarbon groups, examples thereof including, but not limited to, methyl, ethyl, propyl (for example, n-propyl or isopropyl), butyl (for example, n-butyl, isobutyl or tert-butyl), pentyl, hexyl and the like. Unless otherwise specified, in the present invention the "alkyl" can be substituted or unsubstituted. The substituents include, for example, but not limited to, halogen, hydroxyl, —CN, $C_6$-$C_{14}$ aryl, 5- or 6-membered heterocyclyl group containing nitrogen and so on.

In the present invention, the term "aryl" refers to, for example, aromatic carbon ring systems of monocyclic ring, bicyclic ring or tricyclic ring having 6 to 14 carbon atoms, examples thereof including, but not limited to, phenyl, tolyl, naphthyl, fluorenyl, anthryl, phenanthryl and the like. Unless otherwise specified, in the present invention the "aryl" can be substituted or unsubstituted. The substituents include, for example, but not limited to, halogen, hydroxyl, —$NO_2$, alkyl and so on.

In the present invention, the term "arylalkyl" refers to a group constituted of an aryl and an alkyl. The group can be bonded to other group through the aryl or alkyl. Examples thereof include, but not limited to, 3-methylphenyl, 4-methylphenyl or the like. Unless otherwise specified, the "aryl" part and "alkyl" part can be substituted or unsubstituted. The substituents are such as those as described above.

In the present invention, the term "halogen" means fluorine, chlorine, bromine or iodine, preferably fluorine, chlorine or bromine.

The term "alkoxy" refers to —O-alkyl, examples thereof including, but not limited to, methoxy, ethoxy, propoxy, isopropoxy, n-butoxy, isobutoxy, tert-butoxy, pentyloxy, hexyloxy and the like. Unless otherwise specified, the "alkyl" part can be substituted or unsubstituted. The substituents are such as those as described above.

In the present invention, the term "heterocyclyl" refers to saturated, partially saturated (such as those named by dihydro-, trihydro-, tetrahydro- and hexahydro- in the prefix) or unsaturated 3- to 14-membered rings, preferably 4- to 10-membered rings, more preferably 5- to 6-membered rings, constituted of carbon atoms and at least one hetero atom selected from N, O or S. Preferably, it has 1 to 4 hetero atoms; more preferably, it has 1 to 3 hetero atoms. The heterocyclyl cover ring systems of monocyclic ring, bicyclic ring or tricyclic ring, which include fused rings (for example, a fused ring formed by a heterocyclyl together with another heterocyclyl or aromatic carbon ring). Unless otherwise specified, in the present invention, the "heterocyclyl" can be substituted or unsubstituted. The substituents include, for example, but not limited to, halogen, hydroxyl, oxo, alkyl, hydroxyalkyl, —$NO_2$ and so on.

In the present invention, the term "nitrogen-containing heterocyclyl" refers to a 3- to 14-membered heterocyclyl in which at least one carbon atom of the ring is replaced by an N atom. Preferably, it is a 4- to 10-membered nitrogen-containing heterocyclyl, and more preferably, a 5- or 6-membered nitrogen-containing heterocyclyl. Examples thereof include, but not limited to, pyrrolyl, imidazolyl, pyrazolyl, pyrimidinyl, thiazolyl, pyridyl, indolyl, isoindolyl, benzimidazolyl, benzothiazolyl, quinolyl, isoquinolyl and so on. Unless otherwise specified, in the present invention, the "nitrogen-containing heterocyclyl" can be substituted or unsubstituted. The substituents are such as those as described above for "heterocyclyl."

In the present invention, the term "oxygen-containing heterocyclyl" refers to a 3- to 14-membered heterocyclyl in which at least one carbon atom of the ring is replaced by an O atom. Preferably, it is a 4- to 10-membered oxygen-containing heterocyclyl, and more preferably, a 5- or 6-membered oxygen-containing heterocyclyl. Examples thereof include, but are not limited to, furanyl, pyranyl, tetrahydrofuranyl, tetrahydropyranyl, dibenzopyranyl, and the like. Unless otherwise specified, the "oxygen-containing heterocyclyl" may be substituted or unsubstituted in the present invention. The substituents are as defined above for "heterocyclyl."

In the present invention, the term "alkylamino" refers to an amino group in which at least one H is replaced with an alkyl, including monoalkylamino or dialkylamino. Examples include, but not limited to, —NH($C_{1-8}$ alkyl) and —N($C_{1-8}$ alkyl)$_2$.

In the present invention, the term "alkylthio" refers to —S-alkyl, for example, —S—$C_{1-8}$ alkyl.

I. Amic Acid Ester Oligomer and Preparation Method Therefor

The present invention provides a polyimide precursor, which is an amic acid ester oligomer having a structure of Formula (1) below:

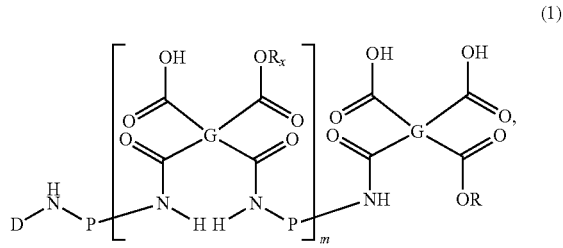

(1)

where
G is each independently a tetravalent organic group;
P is each independently a divalent organic group;
R is $C_1$-$C_{14}$ alkyl, $C_6$-$C_{14}$ aryl unsubstituted or substituted with one or more groups selected from hydroxyl and $C_1$-$C_4$ alkyl, or a group having an ethylenically unsaturated bond;
$R_x$ is each independently H, $C_1$-$C_8$ alkyl, or a group having an ethylenically unsaturated bond:
D is a $C_1$-$C_8$ alkyl unsubstituted or substituted with one or two $C_6$-$C_{14}$ aryl, a $C_1$-$C_8$ haloalkyl, a 5- or 6-membered oxygen-containing heterocyclyl unsubstituted or substituted with one or more groups selected from $C_1$-$C_8$ alkyl and $C_1$-$C_8$ hydroxyalkyl,

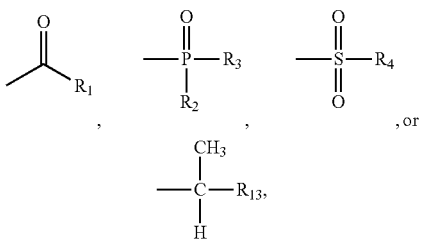

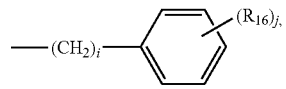

with the provision that two E attached to the same carbon atom are not H at the same time; or two E form, together with C=N— to which they are attached,

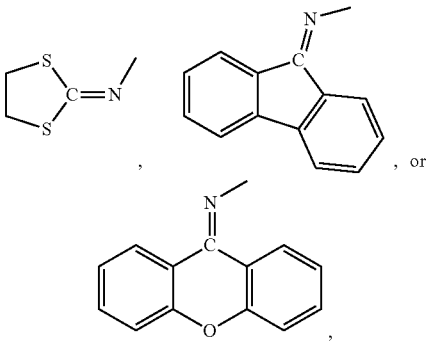

in which $R_{16}$ is each independently halo, hydroxyl, $C_1$-$C_8$ alkoxy, $C_1$-$C_8$ haloalkyl, or —$NO_2$;

i is an integer from 0 to 3;

j is an integer from 0 to 3; and

G, P, R, $R_x$ and m are as defined above.

The above-mentioned $C_1$-$C_{14}$ alkyl may be linear or branched, and is preferably methyl, ethyl, n-propyl, isopropyl, 1-methylpropyl, 2-methylpropyl (i.e. isobutyl), n-butyl, tert-butyl, 1-methylbutyl, 2-methylbutyl, pentyl, hexyl, heptyl, or octyl.

The above-mentioned group having an ethylenically unsaturated bond refers to a group having at least one C=C bond, and is preferably selected from the group consisting of ethenyl, propenyl, methylpropenyl, n-butenyl, iso-butenyl, ethenylphenyl, propenylphenyl, propenyloxymethyl, propenyloxyethyl, propenyloxypropyl, propenyloxybutyl, propenyloxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, and a group of Formula (2):

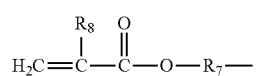
(2)

where $R_7$ is phenylene, $C_1$-$C_8$ alkylene, $C_2$-$C_8$ alkenylene, $C_3$-$C_8$ cycloalkylene, $C_1$-$C_8$ hydroxyalkylene, or

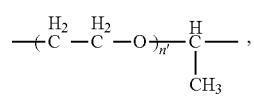

in which n' is an integer of 1 to 4; and $R_8$ is hydrogen or $C_1$-$C_4$ alkyl.

in which $R_1$ is a 5- or 6-membered nitrogen-containing heterocyclyl, a $C_1$-$C_8$ alkyl, a $C_1$-$C_8$ alkoxy, a $C_1$-$C_8$ alkoxy substituted with one or more $C_6$-$C_{14}$ aryl, or a $C_1$-$C_8$ perhaloalkoxy;

$R_2$ and $R_3$ may be the same or different, and are each independently a $C_1$-$C_{10}$ alkoxy unsubstituted or substituted with one or more $C_6$-$C_{14}$ aryl;

$R_4$ is a $C_2$-$C_{14}$ alkyl, a $C_1$-$C_{14}$ alkyl substituted with one or more $C_6$-$C_{14}$ aryl, or a phenyl unsubstituted or substituted with one or more $C_1$-$C_8$ alkyl; and $R_{13}$ is

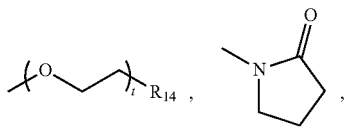

—$OR_{15}$, or a $C_1$-$C_{10}$ alkoxy; where $R_{14}$ is (meth)acryloyloxy;

$R_{15}$ is $C_4$-$C_{10}$ cycloalkyl or oxygen-containing heterocyclyl;

t is an integer from 1 to 20;

and m is an integer from 1 to 100, preferably an integer from 2 to 25, and more preferably an integer from 4 to 15. If m is too large, the resulting amic acid ester oligomer would have an overly large molecular weight, and have the drawbacks of a high viscosity unfavorable to the coating and a poor solubility unfavorable to the development process.

The present invention further provides a polyimide precursor, which is an amic acid ester oligomer having a structure of Formula (1') below:

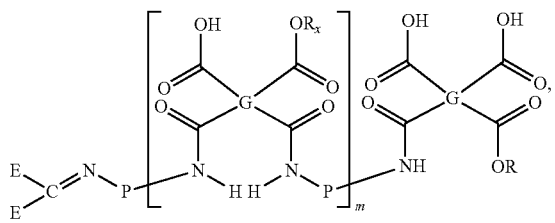
(1')

where the two substituents E contained in the amic acid ester oligomer of Formula (1') may be the same or different, where the two substituents E are each independently H, $C_1$-$C_{14}$ alkyl, alkylamino, alkylthio, $C_4$-$C_{10}$ cycloalkyl, $C_6$-$C_{14}$ aryl, nitro en-containing heterocyclyl, oxygen-containing heterocyclyl, or The above-mentioned $C_6$-$C_{14}$ aryl is preferably

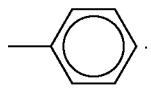.

According to a preferred embodiment of the present invention, R is selected from:

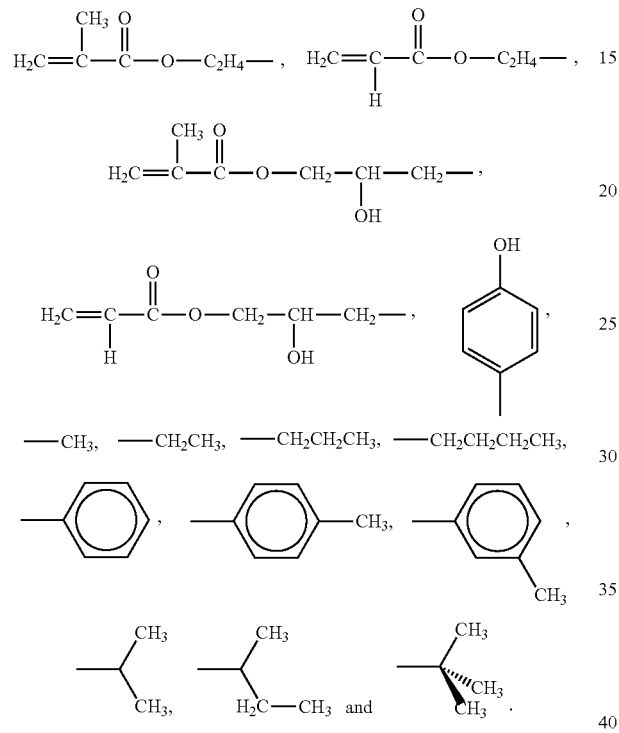

According to a preferred embodiment of the present invention, the group $R_x$ is preferably each independently H, methyl, ethyl, propyl, butyl, 2-hydroxypropyl methacrylate, ethyl methacrylate, ethyl acrylate, propenyl, methylpropenyl, n-butenyl, or iso-butenyl. More preferably, $R_x$ is each independently H or a group of:

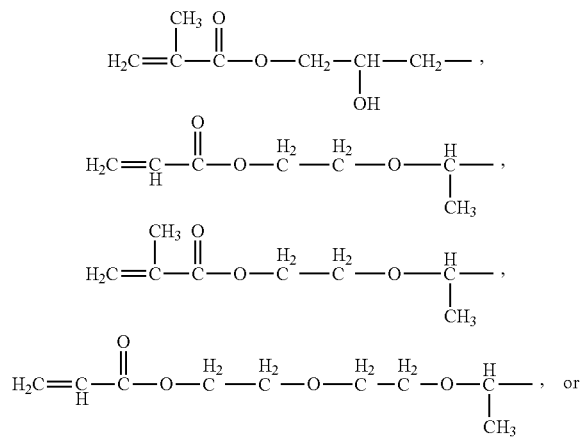

In the present invention, the tetravalent organic group G can be a tetravalent aromatic group, a tetravalent cycloalkyl group, a tetravalent heterocyclyl group or an analogue thereof. Preferably, G is each independently:

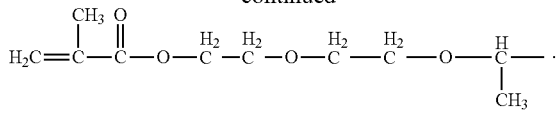

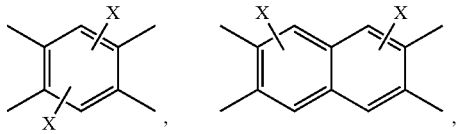

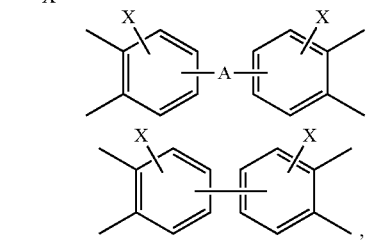

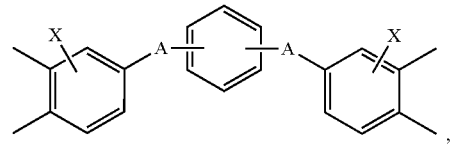

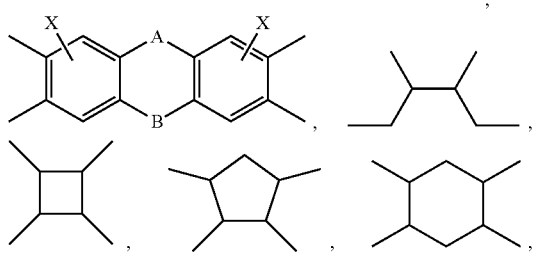

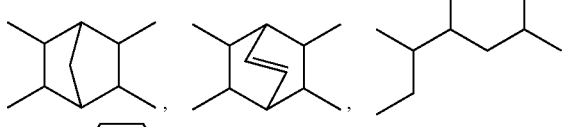

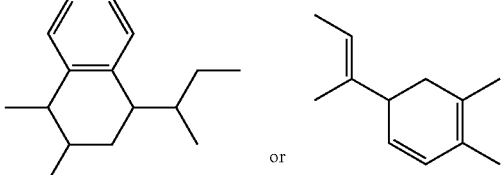

wherein X is each independently hydrogen, halo, $C_1$-$C_4$ perfluoroalkyl, or $C_1$-$C_4$ alkyl; and A and B at each occurrence are each independently a covalent bond, $C_1$-$C_4$ alkylene unsubstituted or substituted with one or more groups selected from hydroxyl and $C_1$-$C_4$ alkyl, $C_1$-$C_4$ perfluoroalkylene, $C_1$-$C_4$ alkyleneoxy, silylene, —O—, —S—, —C(O)—, —OC(O)—, —S(O)$_2$—, —C(=O)O— ($C_1$-$C_4$ alkylene)-OC(=O)—, —CONH—, phenyl, biphenylyl, or

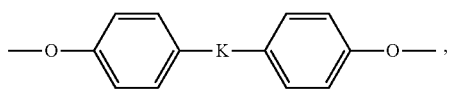
wherein K is —O—, —S(O)$_2$—, C$_1$-C$_4$ alkylene (such as methylene, ethylene or —C(CH$_3$)$_2$—) or C$_1$-C$_4$ perfluoroalkylene (such as perfluoromethylene, perfluoroethylene or —C(CF$_3$)$_2$—).
Preferably, the tetravalent organic group G is each independently selected from a group consisting of:
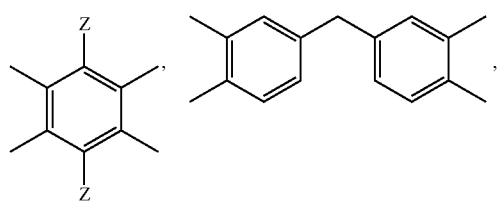
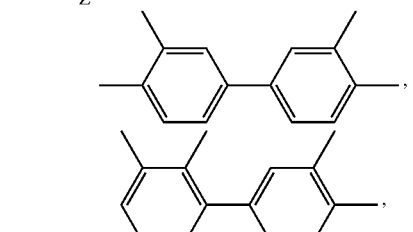
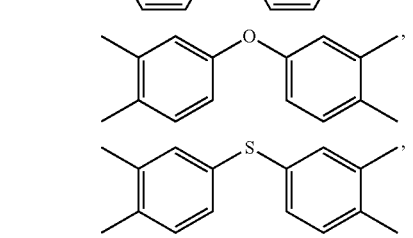
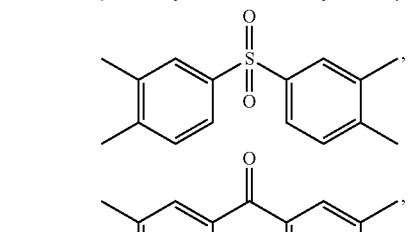
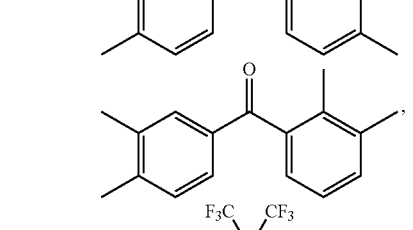
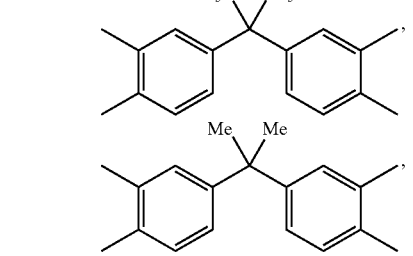
-continued
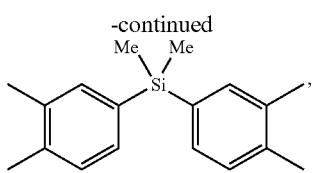
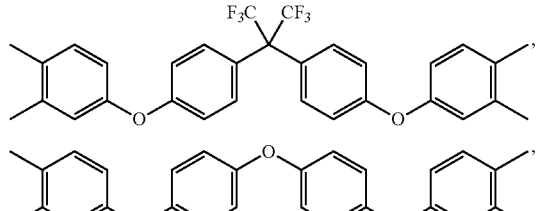
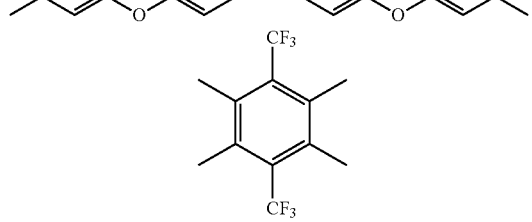
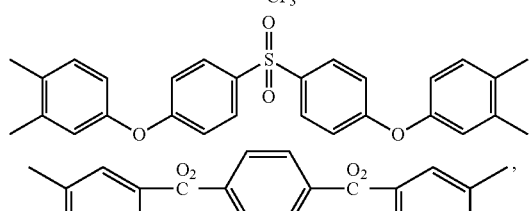
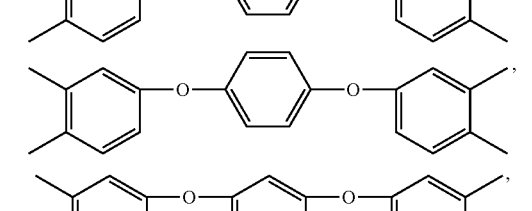
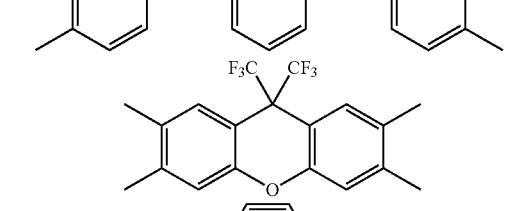
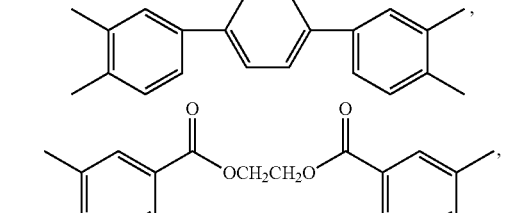
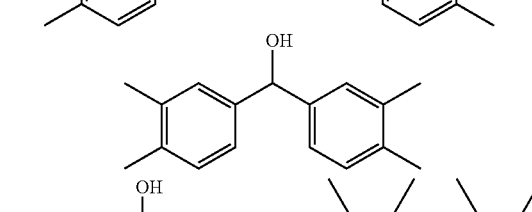
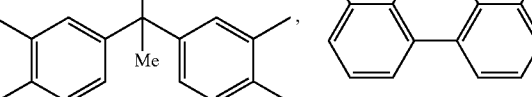

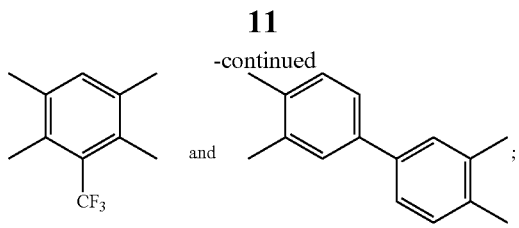

wherein Z is each independently hydrogen, methyl, trifluoromethyl or halo.

More preferably, the tetravalent organic group G is each independently:

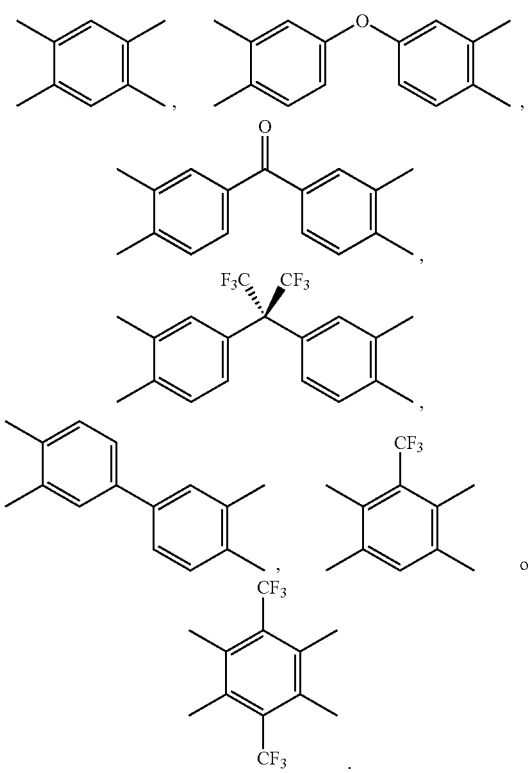

According to an embodiment of the present invention, the tetravalent organic group G is

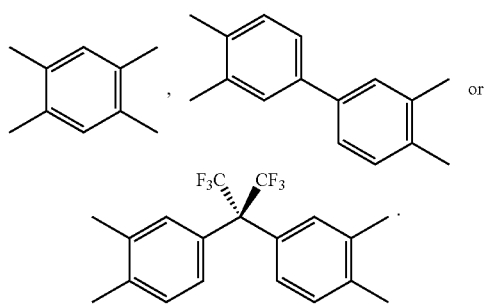

In the present invention, the divalent organic group P is not particularly limited. In general, the divalent organic group P can each independently be a divalent aromatic group, a divalent cycloalkyl group, a divalent heterocyclyl group or a divalent group containing siloxane. P is for example but not limited to:

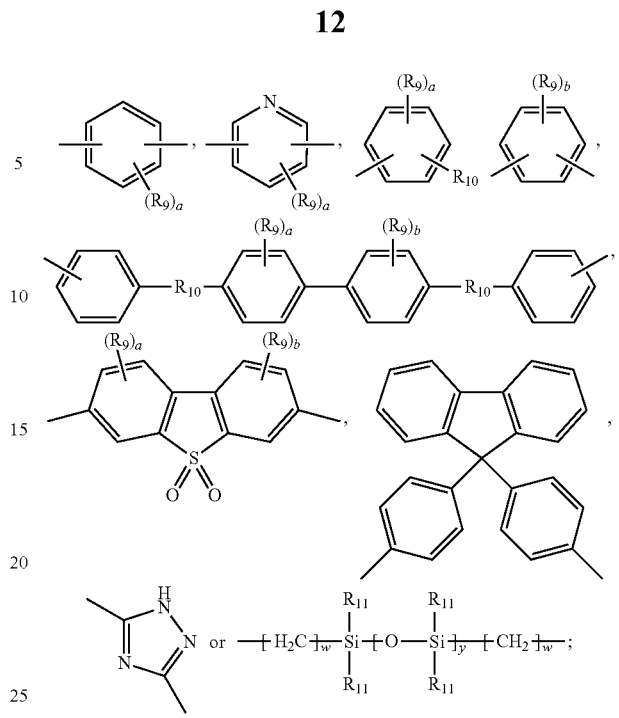

wherein:

$R_9$ is each independently H, $C_1$-$C_4$ alkyl, $C_1$-$C_4$ perfluoroalkyl, $C_1$-$C_4$ alkoxy, halo, —OH, —COOH, —NH$_2$ or —SH;

a is each independently an integer from 0 to 4;

b is each independently an integer from 0 to 4; and $R_{10}$ is a covalent bond or a group selected from the group consisting of:

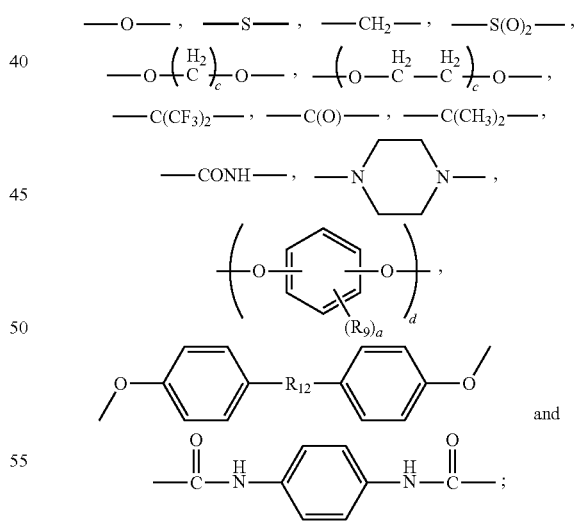

wherein c and d are each independently an integer from 1 to 20; $R_{12}$ is —S(O)$_2$—, —C(O)—, a covalent group, $C_1$-$C_4$ alkyl or $C_1$-$C_4$ perfluoroalkyl; $R_9$ and a are as defined above;

$R_{11}$ is each independently hydrogen, halo, phenyl, $C_1$-$C_4$ alkyl, or $C_1$-$C_4$ perfluoroalkyl; and w and y are each an integer from 1 to 3.

Preferably, the divalent organic group P is each independently:

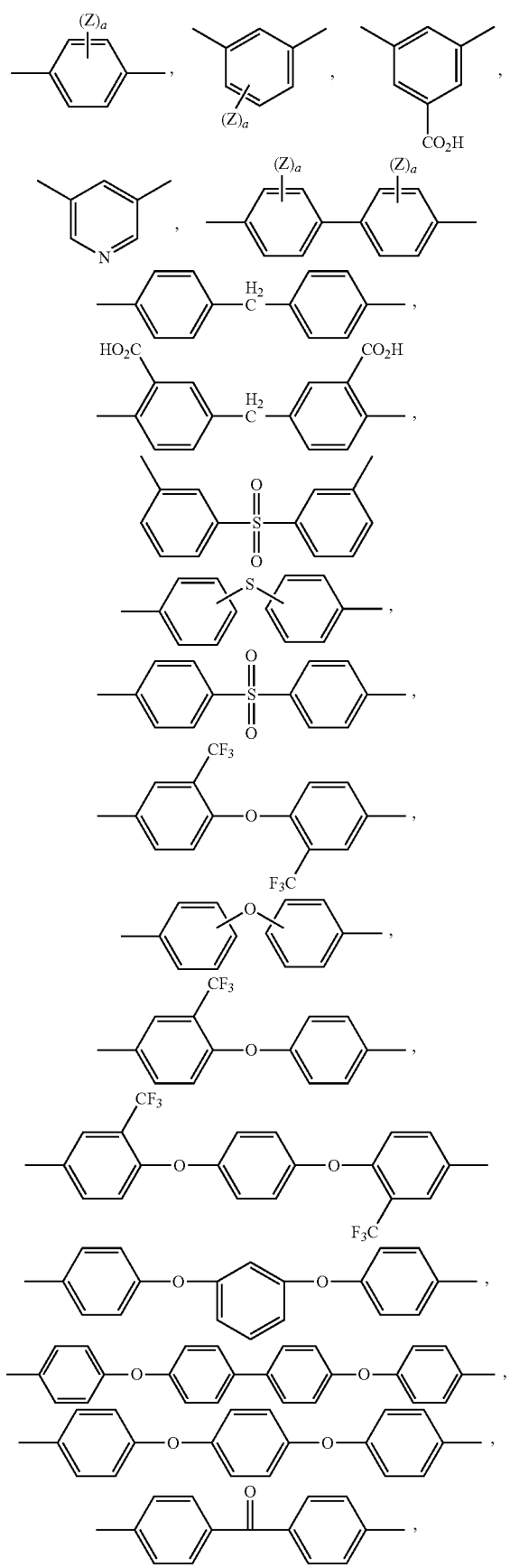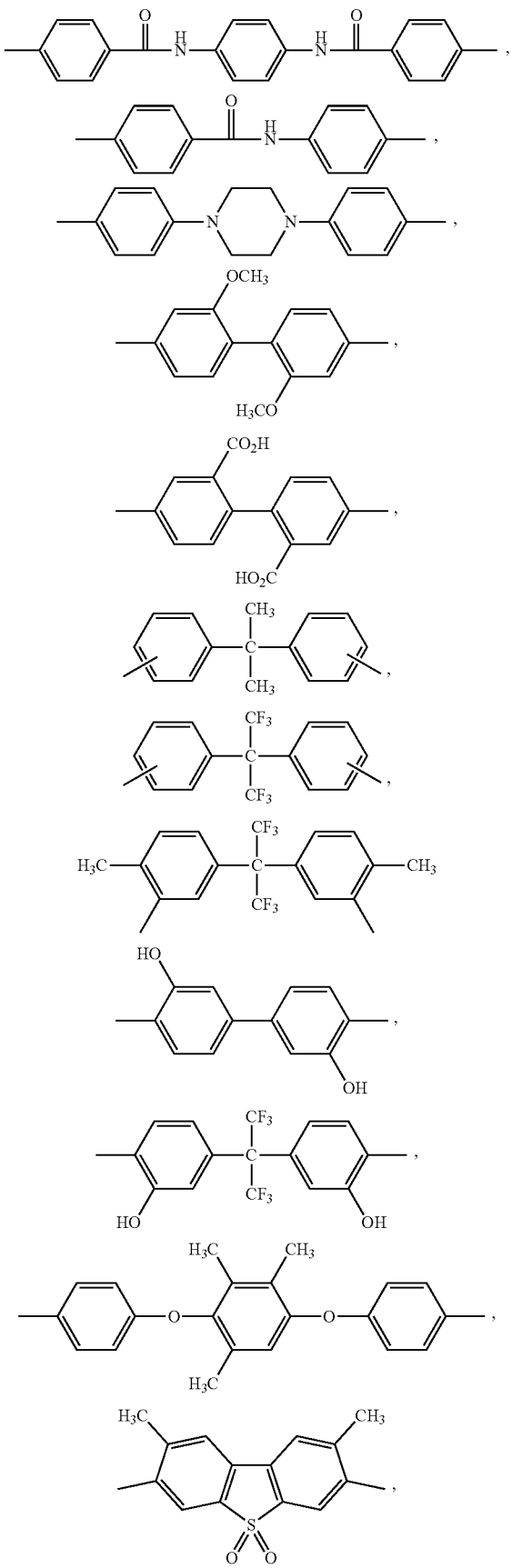

-continued
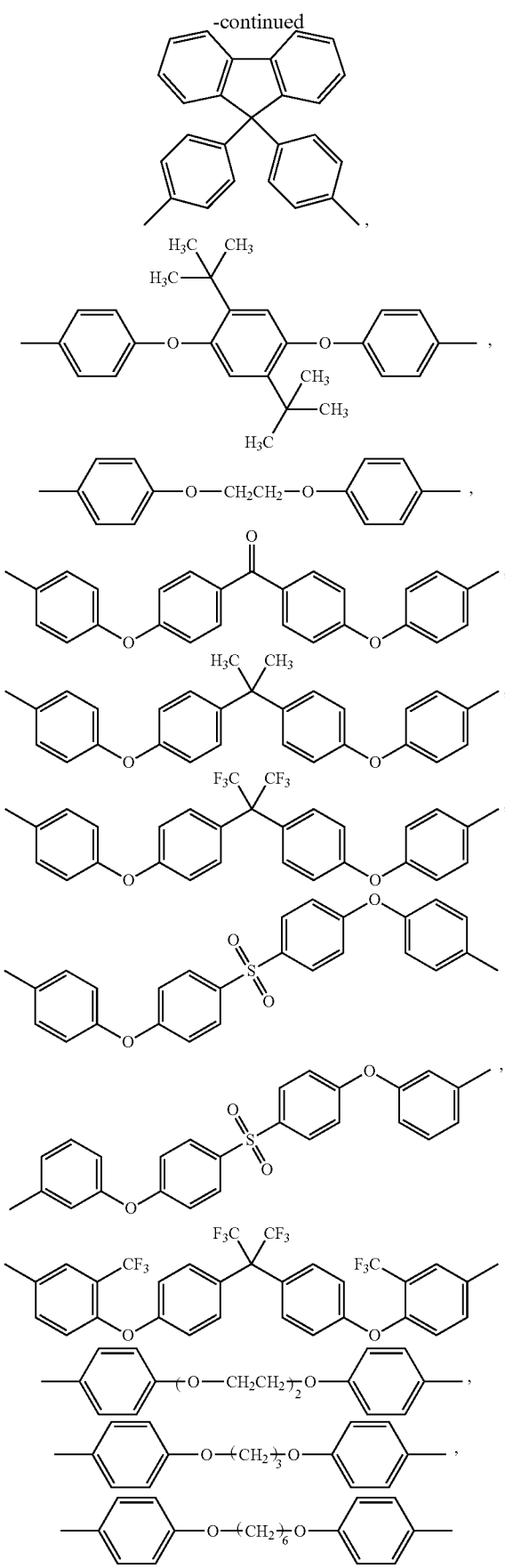
-continued
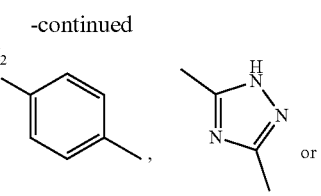
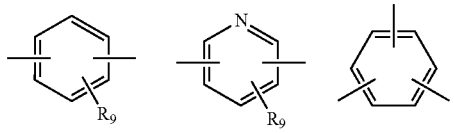
wherein:
a is each independently an integer from 0 to 4; and
Z is each independently hydrogen, methyl, trifluoromethyl or halo.
More preferably, the divalent organic group P is each independently:
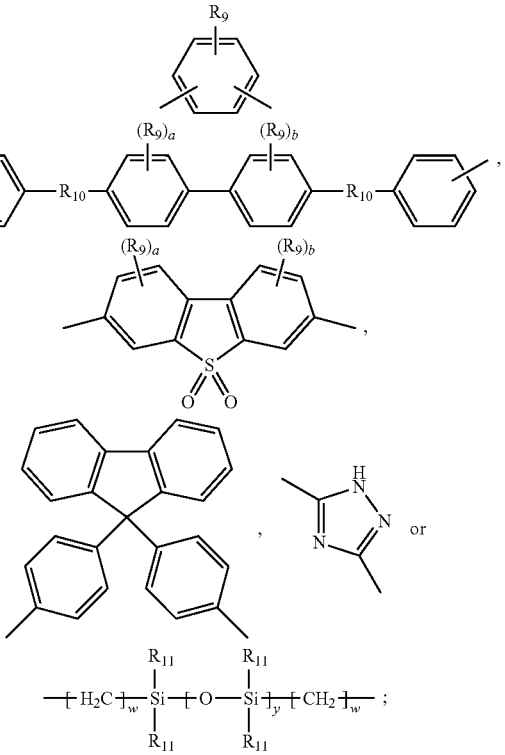
In an embodiment of the present invention, the above-mentioned divalent organic group P is
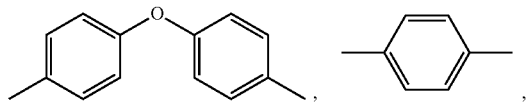

-continued

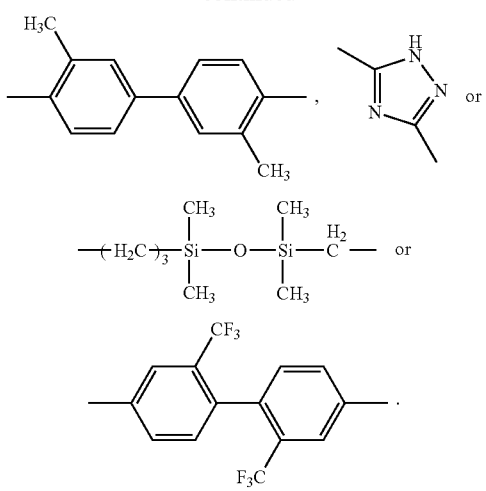

According to an embodiment of the present invention, the substituent D contained in the amic acid ester oligomer of Formula (1) is $C_1$-$C_8$ alkyl unsubstituted or substituted with one or more $C_6$-$C_{14}$ aryl, $C_1$-$C_8$ haloalkyl, or 5- or 6-membered oxygen-containing heterocyclyl unsubstituted or substituted with one or more groups selected from $C_1$-$C_8$ alkyl and $C_1$-$C_8$ hydroxyalkyl.

According to another embodiment of the present invention, the substituent D contained in the amic acid ester oligomer of Formula (1) is

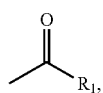

in which $R_1$ is preferably pyrrolyl, imidazolyl, pyrazolyl, pyrimidinyl, thiazolyl, methyl, ethyl, n-propyl, i-propyl, n-butyl, i-butyl, t-butyl, pentyl, hexyl, methoxy, ethoxy, propoxy, butoxy, t-butoxy, pentoxy, hexyloxy, heptyloxy, perfluoromethyloxy, perfluoroethyloxy, perchloromethyloxy, benzyloxy, or fluorenylmethyloxy.

According to another embodiment of the present invention, the substituent D contained in the amic acid ester oligomer of Formula (1) is

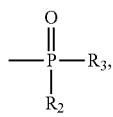

in which $R_2$ and $R_3$ are each independently methoxyalkyl, ethoxyalkyl, n-propoxyalkyl, i-propoxyalkyl, n-butoxyalkyl, i-butoxyalkyl, t-butoxyalkyl, pentoxyalkyl, hexyloxyalkyl, heptyloxyalkyl, octyloxyalkyl, phenoxyalkyl, benzyloxyalkyl, or dibenzyloxyalkyl.

According to another embodiment of the present invention, the substituent D contained in the amic acid ester oligomer of Formula (1) is

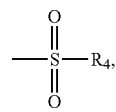

in which $R_4$ is ethyl, n-propyl, i-propyl, n-butyl, i-butyl, t-butyl, pentyl, hexyl, heptyl, octyl, phenyl, benzyl, or dipenylmethyl.

According to another embodiment of the present invention, the substituent D contained in the amic acid ester oligomer of Formula (1) is

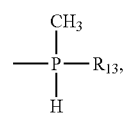

in which $R_{13}$ is

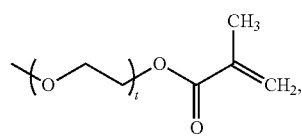

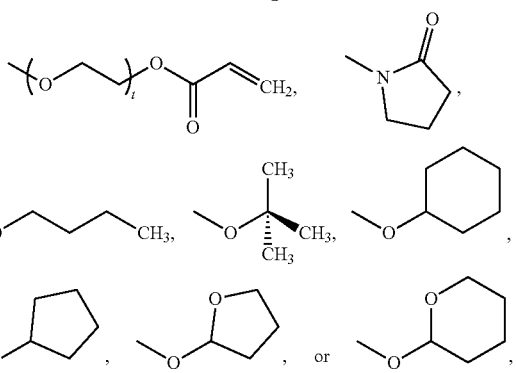

and t is an integer from 1 to 5.

According to a specific embodiment of the present invention, the substituent D contained in the amic acid ester oligomer of Formula (1) is methyl, ethyl, propyl, butyl, or a group selected from the group consisting of:

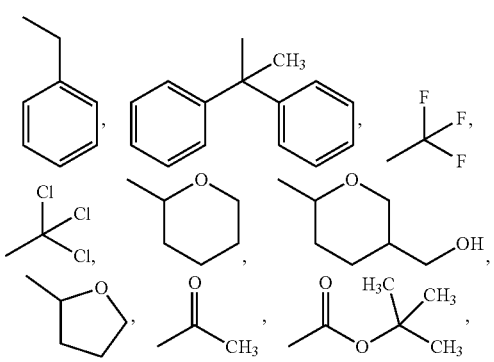

where t is an integer from 1 to 5.

According to a specific embodiment of the present invention, the two substituents E contained in the amic acid ester oligomer of Formula (1') may be the same or different, and are each independently H, phenyl, with the provision that two E are not H at the same time.

According to another embodiment of the present invention, the two substituents E contained in the amic acid ester oligomer of Formula (1') form, together with C=N— to which they are attached, Preparation Method The amic acid ester oligomer of the present invention may be prepared through, without limitation, a method comprising:

(a) reacting a dianhydride of Formula (6) with a compound with a hydroxyl group (R—OH) in the presence of a solvent such as N-methylpyrrolidone (NMP), to form a compound of Formula (7):

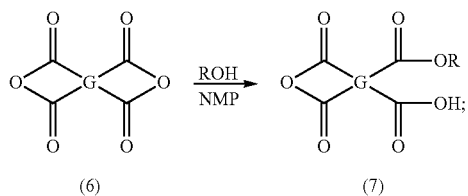

(b) adding a diamine compound (H$_2$N—P—NH$_2$) and the dianhydride of Formula (6) to the product obtained in the step (a), to form an amic acid ester oligomer of Formula (8):

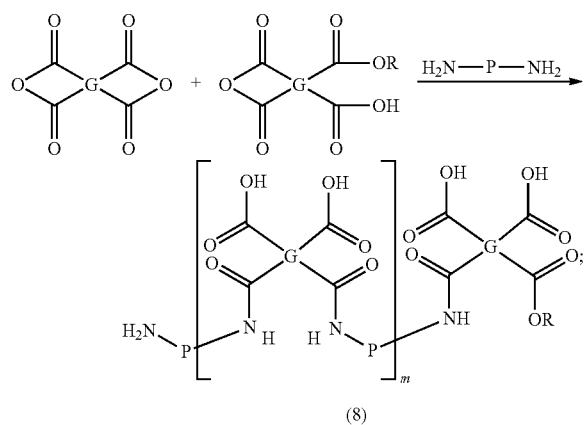

and (c) adding a compound bearing the above-mentioned group D or E, and reacting it with the amic acid ester oligomer of Formula (8), to form an amic acid ester oligomer of Formula (5) or (5'):

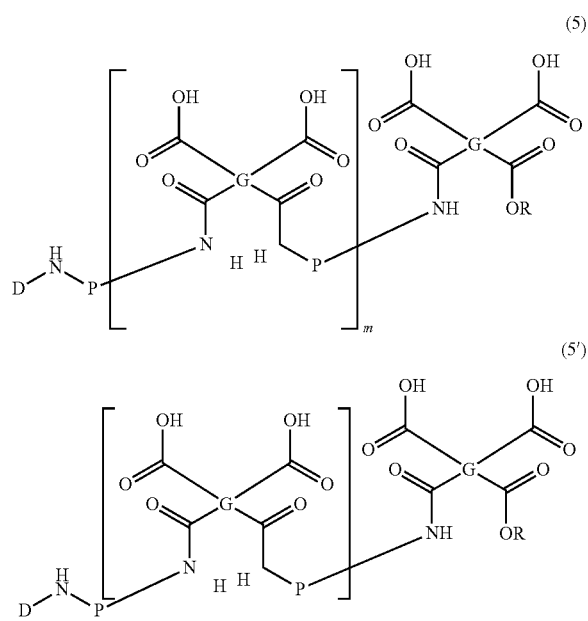

(d) optionally adding one or more compounds having the group ($R_x$), for example, epoxy acrylate, and carrying out the reaction to form an amic acid ester oligomer of Formula (1) or (1'):

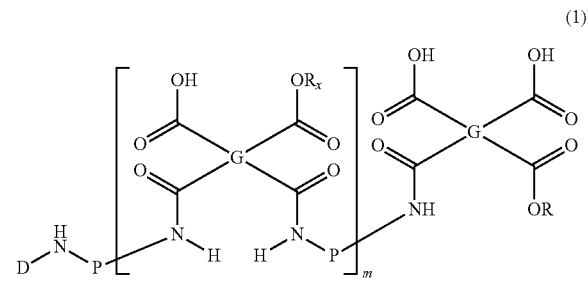

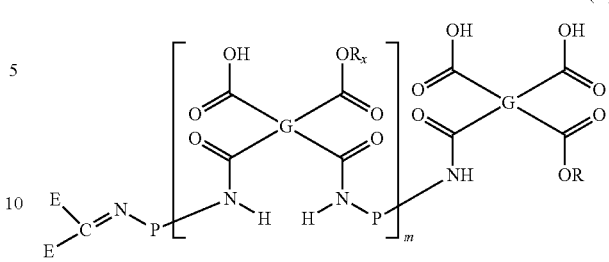

where G, P, R, $R_x$, D, E and m are as defined herein above.

The dianhydride used in step (a) can be aliphatic or aromatic, and is preferably aromatic. The examples of an aromatic dianhydride include, but are not limited to, pyromellitic dianhydride (PMDA), 4,4'-biphthalic dianhydride (BPDA), 4,4'-hexafluoroisopropylidenediphthalic dianhydride (6FDA), 1-(trifluoromethyl)-2,3,5,6-benzenetetracarboxylic dianhydride (P3FDA), benzophenone-tetracarboxylic dianhydride (BTDA), 3,3',4,4'-oxydiphthalic dianhydride (ODPA), 1,4-bis(trifluoromethyl)-2,3,5,6-benzenetetracarboxylic dianhydride (P6FDA), 1-(3',4'-dicarboxyphenyl)-1,3,3-trimethylindan-5,6-dicarboxylic dianhydride, 1-(3',4'-dicarboxyphenyl)-1,3,3-trimethylindan-6,7-dicarboxylic dianhydride, 1-(3',4'-dicarboxyphenyl)-3-methylindan-5,6-dicarboxylic dianhydride, 1-(3',4'-dicarboxyphenyl)-3-methylindan-6,7-dicarboxylic dianhydride, 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-2,4,5,8-tetracarboxylic dianhydride, phenanthrene-1,8,9,10-tetracarboxylic dianhydride, 3,3',4,4'-benzophenonetetracarboxylic dianhydride, 1,2',3,3'-benzophenonetetracarboxylic dianhydride, 3,3',4,4'-biphenyltetracarboxylic dianhydride, 3,3',4,4'-benzophenonetetracarboxylic dianhydride, 2,2',3,3'-biphenyltetracarboxylic dianhydride, 4,4'-isopropylidenediphthalic anhydride, 3,3'-isopropylidenediphthalic anhydride, 4,4'-oxydiphthalic anhydride, 4,4'-sulfonyldiphthalic anhydride, 3,3'-oxydiphthalic anhydride, 4,4'-methylenediphthalic anhydride, 4,4'-thiodiphthalic anhydride, 4,4'-ethylidenediphthalic anhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzene-1,2,3,4-tetracarboxylic dianhydride, pyridine-2,3,5,6-tetracarboxylic dianhydride, and a mixture thereof.

Preferably, the aromatic dianhydride used in step (a) is selected from the group consisting of pyromellitic dianhydride (PMDA), 4,4'-biphthalic anhydride (BPDA), 4,4'-hexafluoroisopropylidenediphthalic dianhydride (6FDA), 1-(trifluoromethyl)-2,3,5,6-benzenetetracarboxylic dianhydride (P3FDA), 1,4-bis(trifluoromethyl)-2,3,5,6-benzenetetracarboxylic dianhydride (P6FDA), benzophenonetetracarboxylic dianhydride (BTDA), 3,3',4,4'-oxydiphthalic anhydride (ODPA), and a mixture thereof. In one embodiment, pyromellitic dianhydride (PMDA) is used.

The compound having a hydroxyl group used in step (a) can be an alcohol, such as a mono-ol, a diol, or a polyol, preferably a mono-ol. The mono-ol useful in the present invention is not particularly limited and can be an alkanol, an aralkanol, or an arylol. The mono-ol can be (but is not limited to) a linear or branched alkanol with 1 to 14 carbon atoms, such as but not limited to, methanol, ethanol, n-propanol, isopropanol, 1-methylpropanol, n-butanol, isobutanol, neobutanol, 1-methylbutanol, 2-methylbutanol, pentanol, hexanol, heptanol, and octanol. The mono-ol useful in the present invention can also be an aralkanol or arylol with 6 to 14 carbon atoms, such as but not limited to, phenol, m-cresol or p-cresol.

The above-mentioned compound having a hydroxyl group used in the process of the present invention can optionally also bear a photosensitive group, such as a group having an ethylenically unsaturated bond as mentioned above. Preferably, the compound has the following Formula (10):

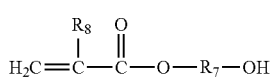
(10)

wherein $R_7$ and $R_8$ are those as defined above. Preferably, the compound of Formula (10) is selected from the group consisting of 2-hydroxyethyl acrylate (HEA), 2-hydroxyethyl methacrylate (HEMA), and a mixture thereof.

The diamine used in step (b) is not particularly limited and can be an aromatic diamine. The aromatic diamines useful in the process of the present invention are well known to persons having ordinary skill in the art. For example, the aromatic diamine can be selected from, but is not limited to, the following group: 4,4'-oxy-dianiline (ODA), para-phenylenediamine (pPDA), 2,2-dimethyl-4,4-diamino-biphenyl (DMDB), 2,2'-bis(trifluoromethyl) benzidine (TFMB), o-tolidine (oTLD), 4,4'-octafluorobenzidine (OFB), tetrafluorophenylenediamine (TFPD), 2,2',5,5'-tetrachlorobenzidine (TCB), 3,3'-dichlorobenzidine (DCB), 2,2'-bis(3-aminophenyl)hexafluoropropane, 2,2'-bis(4-aminophenyl)hexafluoropropane, 4,4'-oxo-bis(3-trifluoromethyl)aniline, 3,5-diaminobenzotrifluoride, tetrafluorophenylene diamine, tetrafluoro-m-phenylene diamine, 1,4-bis(4-aminophenoxy-2-tert-butylbenzene (BATB), 2,2'-dimethyl-4,4'-bis(4-aminophenoxy)biphenyl (DBAPB), 2,2-bis[4-(4-aminophenoxy)phenyl]hexafluoropropane (BAPPH), 2,2'-bis[4-(4-aminophenoxy)phenyl]norborane (BAPN), 5-amino-1-(4'-aminophenyl)-1,3,3-trimethylindane, 6-amino-1-(4'-aminophenyl)-1,3,3-trimethylindane, 4,4'-methylenebis(o-chloroaniline), 3,3'-dichlorobenzidine, 3,3'-sulfonyldianiline, 4,4'-diaminobenzophenone, 1,5-diaminonaphthalene, bis(4-aminophenyl)diethyl silane, bis(4-aminophenyl)diphenyl silane, bis(4-aminophenyl)ethyl phosphine oxide, N-(bis(4-aminophenyl)-N-methyl amine, N-(bis(4-aminophenyl))-N-phenyl amine, 4,4'-methylenebis (2-methylaniline), 4,4'-methylenebis(2-methoxyaniline), 5,5'-methylenebis(2-aminophenol), 4,4'-methylenebis(2-methylaniline), 4,4'-oxybis(2-methoxyaniline), 4,4'-oxybis (2-chloroaniline), 2,2'-bis(4-aminophenol), 5,5'-oxybis(2-aminophenol), 4,4'-thiobis(2-methylaniline), 4,4'-thiobis(2-methoxyaniline), 4,4'-thiobis(2-chloroaniline), 4,4'-sulfonylbis(2-methylaniline), 4,4'-sulfonylbis(2-ethoxyaniline), 4,4'-sulfonylbis(2-chloroaniline), 5,5'-sulfonylbis(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, 4,4'-methylenedianiline (MDA), 4,4'-thiodianiline, 4,4'-sulfonyldianiline, 4,4'-isopropylidenedianiline, 3,3'-dimethoxybenzidine, 3,3'-dicarboxybenzidine, 2,4-tolyl-diamine, 2,5-tolyl-diamine, 2,6-tolyl-diamine, m-xylyldiamine, 2,4-diamino-5-chloro-toluene, 2,4-diamino-6-chloro-toluene, and a mixture thereof. Preferably, the diamine is 4,4'-oxy-dianiline (ODA), para-phenylenediamine (pPDA), 2,2-dimethyl-4,4-diamino-biphenyl (DMDB), 2,2'-bis(trifluoromethyl)benzidine (TFMB), o-tolidine (oTLD), 4,4'-methylenedianiline (MDA), 3,5-diamino-1,2,4-triazole or a mixture thereof.

Preferably, the diamine used in step (b) is selected from the group consisting of:

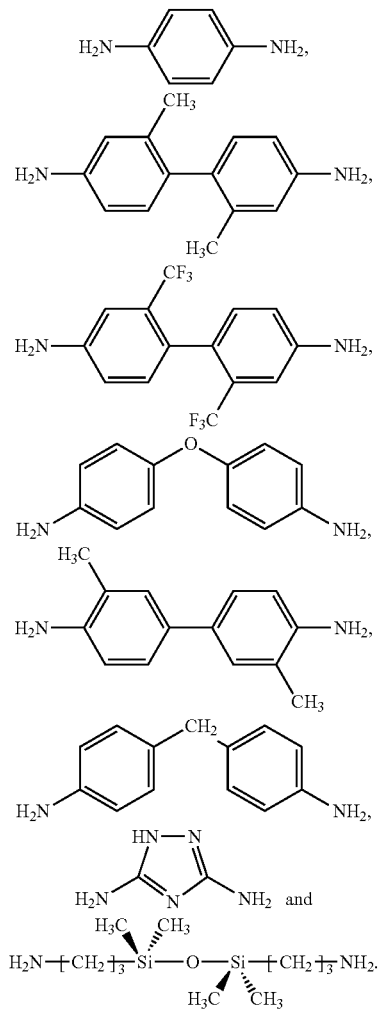

The compound bearing the group D or E used in step (c) may be any compound bearing the above-mentioned group D or E and capable of reacting with the terminal amino group of the amic acid ester oligomer of Formula (8), for example, but not limited to:

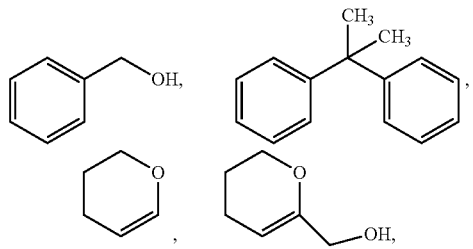

ethanol, hexachloroacetone,

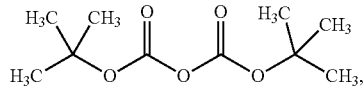

trichloromethyl chloroformate,

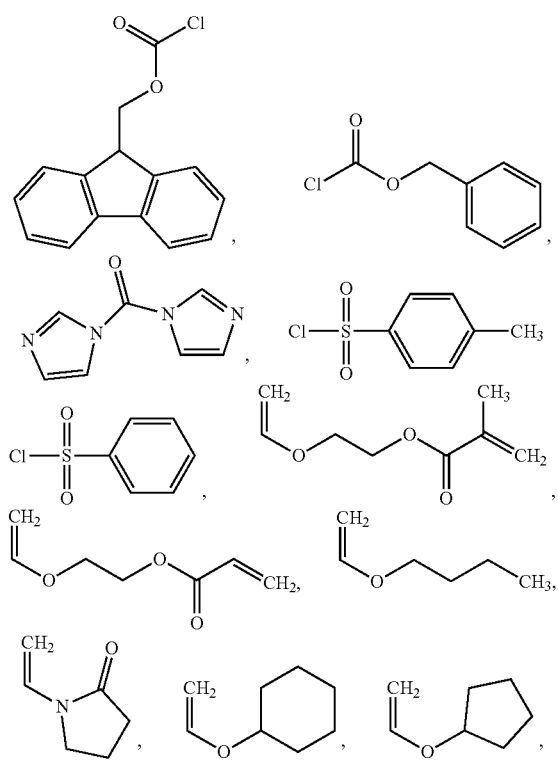

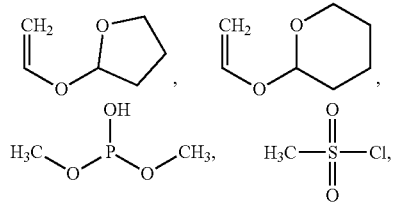

N,N-dimethylformamide dimethyl acetal, or

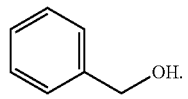

During the long-term storage at room temperature, a few amino groups in the amic acid ester oligomers may react with the terminal groups at the other end to form larger molecules, causing an elevated viscosity and poor operability. Moreover, the terminal amino group of the amic acid ester oligomer is prone to react with a dehydrating agent. To resolve the above problems, in step (c) of the present invention, the compound bearing the group D or E serves as a protectant, and reacts with the terminal amino group of the compound of Formula (8), to form a terminal group that is stable at room temperature and does not react with a dehydrating agent.

If

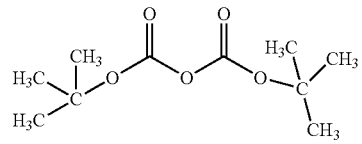

is used as a protectant, the reaction scheme is as follows:

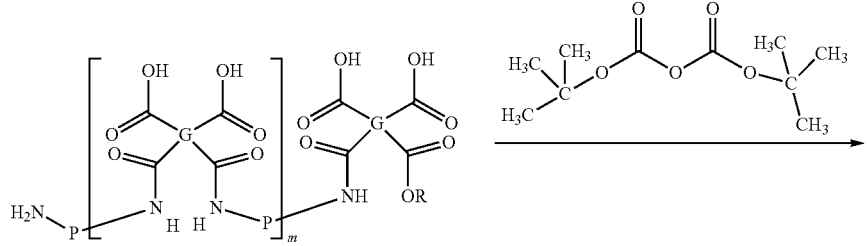

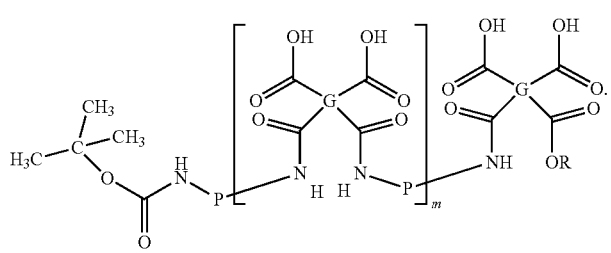

If ethanol is used as a protectant, the reaction scheme is as follows:

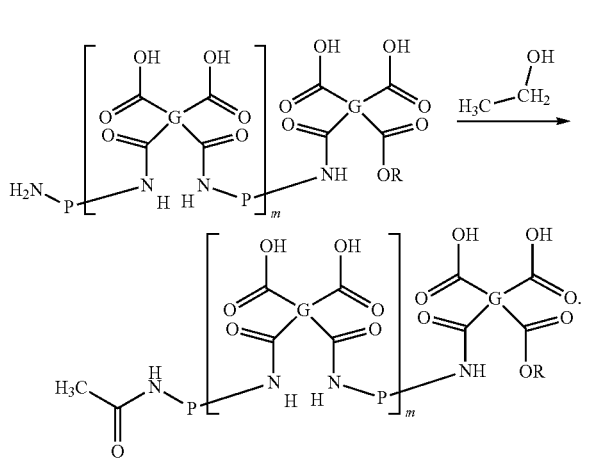

If

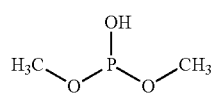

is used as a protectant, the reaction scheme is as follows:

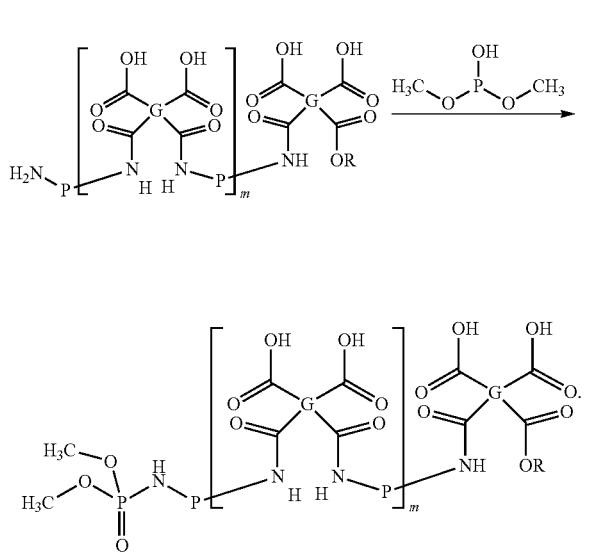

If

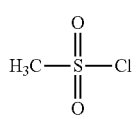

is used as a protectant, the reaction scheme is as follows:

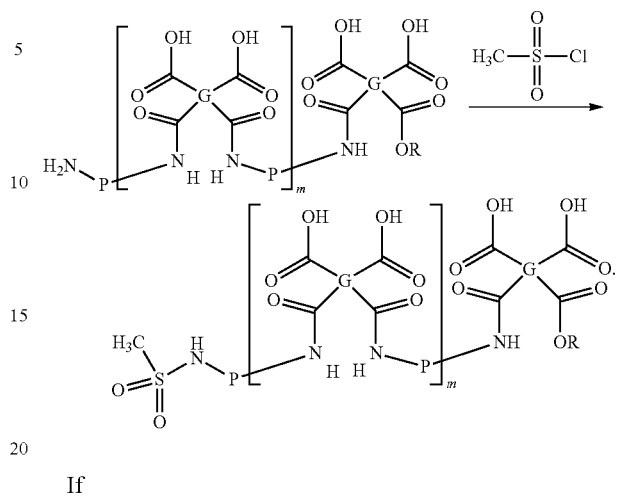

If

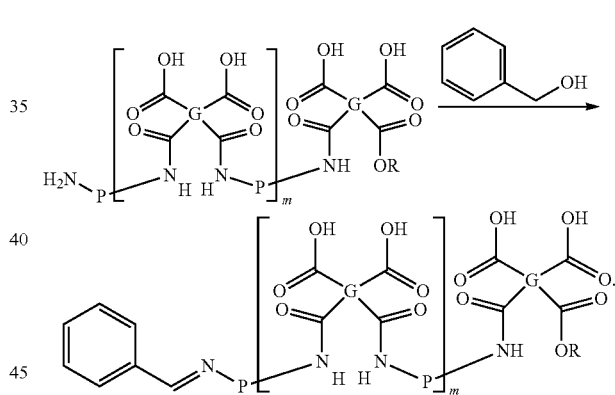

is used as a protectant, the reaction scheme is as follows:

Furthermore, since the amic acid ester oligomer of Formula (8) has a terminal amino group and the nitrogen atom on the amino group contains a lone electron pair, the amic acid ester oligomer of Formula (8) can act as a nucleophilic reagent. If a chemical imidization process is directly employed, the amic acid ester oligomer of Formula (8) may react with a positively charged carbon atom, and thus react with a dehydrating agent (such as acetic anhydride), and is acylated, etc., causing that the amic acid ester oligomer cannot be further polymerized into a polyimide of high molecular weight. To solve this technical problem, the present inventors found through research that the terminal amino group of the amic acid ester oligomer of Formula (8) may be modified with a particular group D or E, to provide a temporary protection for preventing the terminal amino group of the amic acid ester oligomer from reacting with a dehydrating agent. The amic acid ester oligomer of Formula (1) or (1') obtained in the present invention has a particular amino-protecting group D or E at the end, such that the reactivity at room temperature decreases, and no reaction with the terminal ester group (—COOR) and carboxyl group (—COOH) of Formula (8) or a dehydrating agent occurs. In addition, the group D or E can be removed in a subsequent heating process, such that the amic acid ester oligomer of Formula (1) or (1') has improved storage stability and can be cyclized and polymerized by chemical imidization, to form a polyimide having excellent thermal, mechanical and tensile properties. Furthermore, the hard bake temperature of the polyimide can be further reduced by using chemical imidization.

The amic acid ester oligomer of Formula (1) or (1') prepared in the present invention has an ester group (—COOR) and a carboxyl group (—COOH) at one end, and an amino group substituted with a particular group D or E at the other end, and experiences no polymerization and cyclization at room temperature. However, when the temperature is elevated, the group D or E is removed and —$NH_2$ is formed through reduction. Then, polymerization occurs to further form a larger polymer, which is then condensed to provide a polyimide having excellent thermal, mechanical and tensile properties. The amic acid ester oligomer of Formula (1) or (1') of the present invention has a small viscosity, and thus a high leveling performance and a good operability upon coating. The amic acid ester oligomer of Formula (1) or (1') of the present invention has good storage stability, and a polyimide precursor composition comprising the amic acid ester oligomer of Formula (1) or (1') is not only applicable to a thermal imidization process, but also more suitable for use with a chemical imidization process. Compared with the thermal imidization process, the chemical imidization process can be performed at a lower temperature, the process is rapid, and the film forming performance is good. In addition, the group D or E in the amic acid ester oligomer of Formula (1) or (1') provided in the present invention has a particular design. Under an acid condition, the group D or E is facilitated to be removed and —$NH_2$ is formed through reduction. Therefore, a photoacid generator may be added to and directly used in the exposure and development process, thereby effectively solving the problem existing in the prior art.

II. Polyimide Precursor Composition

The present invention further provides a polyimide precursor composition, which comprises an amic acid ester oligomer of Formula (1) or (1') and a solvent. The polyimide precursor composition may be a photosensitive polyimide precursor composition or a non-photosensitive polyimide precursor composition.

The solvent used in the composition of the present invention is preferably a polar aprotic solvent. For example and without limitation, the solvent is selected from the group consisting of dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol methyl ether, tetraethylene glycol dimethyl ether, diethylene glycol dibutyl ether, methanol, ethanol, butanol, butylcellosolve, γ-butyrolactone, xylene, toluene, hexamethylphosphoramide, propylene glycol methyl ether acetate,

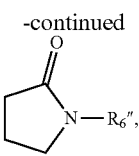

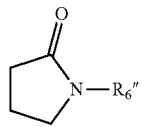

and a mixture thereof,
where
$R_1''$ is each independently H, $C_1$-$C_{20}$ alkyl, $C_2$-$C_{20}$ alkenyl, or $C_2$-$C_{20}$ alkynyl;
$R_7''$ is H or $C_1$-$C_3$ alkyl;
$R_2''$ is H, $C_1$-$C_{15}$ alkyl, or $C_4$-$C_8$ cycloalkyl;
$R_3''$ and $R_4''$ are each independently $C_1$-$C_{10}$ alkyl, or $R_3''$ and $R_4''$ form, together with the nitrogen atom to which they are attached, a 5- to 6-membered heterocyclic ring; and
$R_6''$ is $C_1$-$C_{15}$ alkyl, $C_2$-$C_{20}$ alkenyl, or $C_4$-$C_8$ cycloalkyl.

Examples of solvents having the structure of

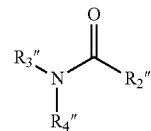

include, but not limited to, N,N-dimethylformamide, N,N-diethylformamide, N,N-dimethylacetamide, N,N-diethylacetamide, or N,N-dimethylcapramide.

Examples of solvents having the structure of

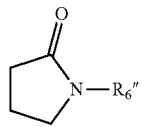

include, but not limited to, N-methyl-2-pyrrolidone, N-ethenyl-2-pyrrolidone, N-ethyl-2-pyrrolidone, or N-octyl-2-pyrrolidone (NOP).

The solvent is preferably selected from the group consisting of: dimethyl sulfoxide (DMSO), diethyl sulfoxide, N,N-dimethylformamide (DMF), N,N-diethylformamide, N,N-dimethylacetamide (DMac), N,N-diethylacetamide, N-methyl-2-pyrrolidone (NMP), N-ethyl-2-pyrrolidone (NEP), N-octyl-2-pyrrolidone (NOP), N,N-dimethylcapramide and γ-butyrolactone (GBL). In the polyimide precursor composition according to the present invention, the content of the amic acid ester oligomer is 15 to 70% and preferably 25 to 60%, and the content of the solvent is 30 to 85% and preferably 40 to 75%, based on the total weight of the composition.

The polyimide precursor composition according to the present invention may optionally comprise any additive known to those of ordinary skill in the art for preparing polyimides, for example, but not limited to, a leveling agent, an anti-forming agent, a coupling agent, a dehydrating agent, a catalyst, a photoinitiator, and a co-initiator. The content of the additives can also be adjusted by persons of ordinary skill in the art through routine experiments.

The suitable photoinitiator in the present invention can be selected from the group consisting of, without limitation, benzophenone, benzoin, 2-hydroxy-2-methyl-1-phenyl propanone, 2,2-dimethoxy-1,2-diphenylethan-1-one, 1-hy-

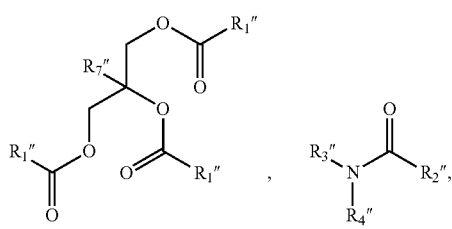

droxy-cyclohexyl-phenyl ketone, 2,4,6-trimethylbenzoyl diphenyl phosphine oxide, or a combination thereof.

The coupling agent useful in the present invention may be selected from a group consisting of, without limitation, 3-aminopropyltrimethoxysilane (APrTMOS), 3-triaminopropyltriethoxysilane (APrTEOS), 3-aminophenyltrimethoxysilane (APTMOS), 3-aminophenyltriethoxysilane (APTEOS), and a combination thereof.

The group D or E at the end of the amic acid ester oligomer of Formula (1) or (1') of the present invention can be easily removed by heating, and then —$NH_2$ is formed through reduction. Compared with other protecting groups that may require additional addition of other additives to remove these protecting groups or can be removed only at a high temperature, in the present invention, the group D or E can be removed and —$NH_2$ is formed through reduction only at 50-150° C. and preferably 50-100° C. Then, polymerization occurs to further form a larger polymer.

An alkaline environment can facilitate the cyclization of the amic acid ester oligomer into a polyimide at a reduced cyclization temperature. However, if a basic compound is directly added to the composition, it would lead to drawbacks such as reduced storage stability. Therefore, the polyimide precursor composition of the present invention may optionally comprise a thermal base generator, which releases a basic compound upon heating. For example, when a thermal base generator is added, a basic compound is released from the thermal base generator by heating for 5-180 min at, for example, about 50-250° C., whereby it facilitates the cyclization of the amic acid ester oligomer of Formula (1) or (1') to form a polyimide. Compared with the conventional thermal imidization of prior art that needs to be carried out at a high temperature of 300-350° C., the amic acid ester oligomer is allowed to be imidized at a lower heating temperature by adding a thermal base generator to the polyimide precursor composition of the present invention, and thus the preparation process is advantageous.

The thermal base generator useful in the present invention may be any thermal base generator familiar to those of ordinary skill in the art to which the present invention pertains, for example, but not limited to, a thermal base generator having a structure of

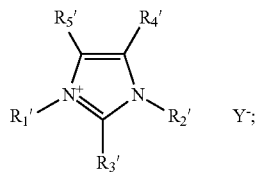

(C)

wherein $R_1'$ and $R_2'$ are the same or different and are each independently H, $C_1$-$C_6$ alkyl, $C_1$-$C_6$ haloalkyl, or $C_1$-$C_6$ alkyl substituted with one or more $C_6$-$C_{14}$ aryl, or

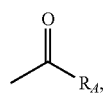

wherein $R_A$ is $C_1$-$C_6$ alkyl, $C_1$-$C_6$ haloalkyl, $C_1$-$C_8$ alkoxy unsubstituted or substituted with one or more $C_6$-$C_{14}$ aryl, or —$NR_ER_F$, and $R_E$ and $R_F$ are the same or different, and are each independently H, linear or branched $C_1$-$C_{14}$ alkyl unsubstituted or substituted with one or more $C_6$-$C_{14}$ aryl, or $C_6$-$C_{14}$ aryl; $R_3'$, $R_4'$ and $R_5'$ are the same or different, and are each independently H, $C_1$-$C_6$ alkyl unsubstituted or substituted with one or more $C_6$-$C_{14}$ aryl, $C_1$-$C_6$ hydroxyalkyl, $C_1$-$C_6$ cyanoalkyl, or $C_6$-$C_{14}$ aryl; and $Y^-$ is an anionic group.

According to an embodiment of the present invention, the groups $R_1'$ and $R_2'$ in Formula (C) are the same or different and are each independently $C_1$-$C_6$ alkyl, or

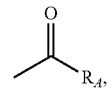

wherein $R_A$ is $C_1$-$C_6$ alkyl, $C_1$-$C_6$ haloalkyl, $C_1$-$C_8$ alkoxy unsubstituted or substituted with one or more $C_6$-$C_{14}$ aryl, or —$NR_ER_F$. Preferably, $R_A$ is methyl, ethyl, n-propyl, isopropyl, n-butyl, isobutyl, tert-butyl, pentyl, hexyl, trifluoromethyl, pentafluoethyl, methoxy, ethoxy, propoxy, butoxy, pentyloxy, hexyloxy, benzyloxy or fluorenylmethoxy.

According to an embodiment of the present invention, the groups $R_1'$ and $R_2'$ in Formula (C) are the same or different and are each independently methyl, ethyl, propyl, butyl or selected from a group consisting of:

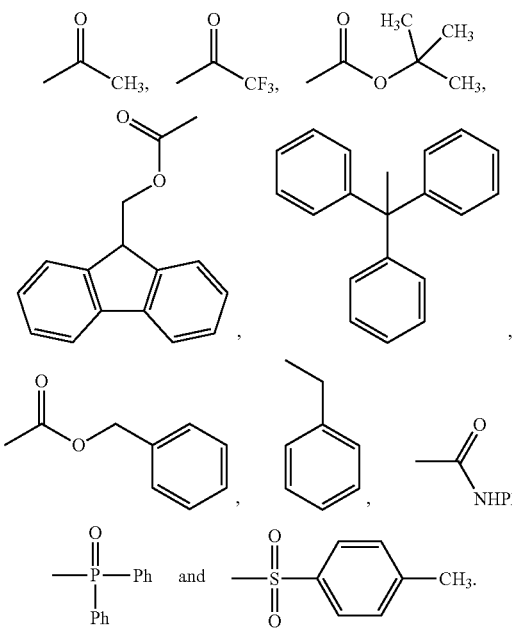

Preferably, $R_1'$ and $R_2'$ are the same or different and are each independently methyl, ethyl or selected from a group consisting of:

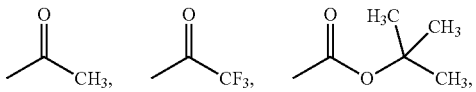

-continued

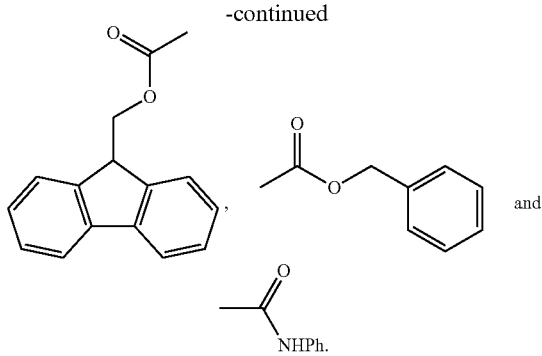

According to an embodiment of the present invention, $R_3'$, $R_4'$ and $R_5'$ in Formula (C) are the same or different and are each independently H, methyl, ethyl, n-propyl, isopropyl, n-butyl, isobutyl, tert-butyl, pentyl, hexyl, hydroxymethyl, hydroxyethyl, hydroxypropyl, hydroxybutyl, hydroxypentyl, hydroxyhexyl, cyanomethyl, cyanoethyl, cyanopropyl, cyanobutyl, cyanopentyl, cyanohexyl, phenyl, benzyl, or diphenylmethyl; preferably, hydroxybutyl is

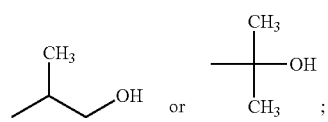

preferably, hydroxypentyl is

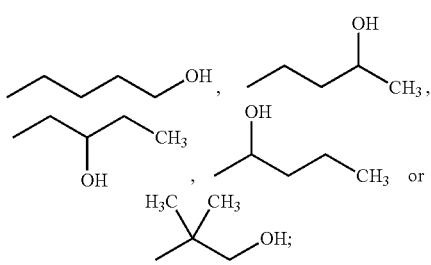

preferably, cyanobutyl is

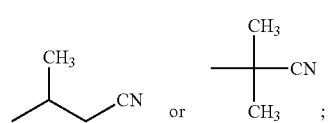

and preferably, cyanopentyl is

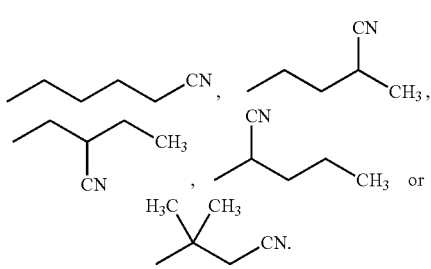

Preferably, $R_3'$, $R_4'$ and $R_5'$ are the same or different and are each independently H, methyl, ethyl, n-propyl or isopropyl.

The anionic group in Formula (C) is not particularly limited, examples thereof including, but not limited to, halide ion, sulfate, nitrate, phosphate, sulfonate, carbonate, tetrafluoborate, borate, chlorate, iodate, hexafluorophosphate, perchlorate, trifluoromethanesulfonate, trifluoroacetate, acetate, tert-butylcarbonate, $(CF_3SO_2)_2N^-$ or tert-butyloxy. According to an embodiment of the present invention, the anionic group in Formula (C) is halide ion or tetrafluoborate. Preferably, the halide ion is fluoride ion and chloride ion.

In addition to Formula (C), the thermal base generator used in the present invention also can be

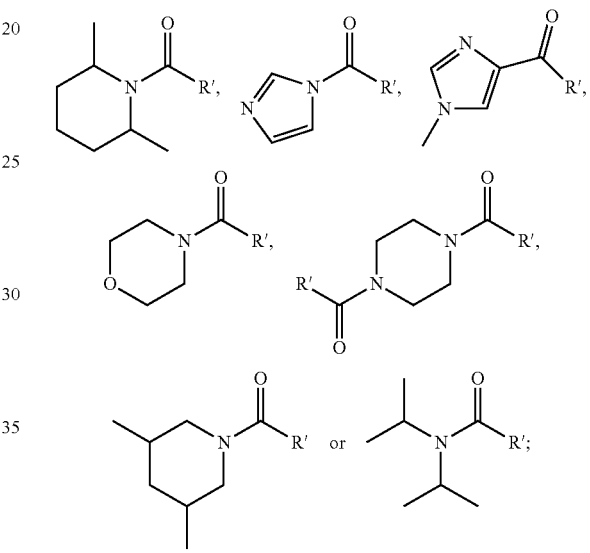

wherein R' is $C_1$-$C_6$ alkyl or $C_1$-$C_6$ alkyloxy and the above-mentioned groups can be optionally substituted with one or more halogen atom or phenyl. Preferably, R' is —$CF_3$ or —O-tbu.

Preferably, the thermal base generator is:

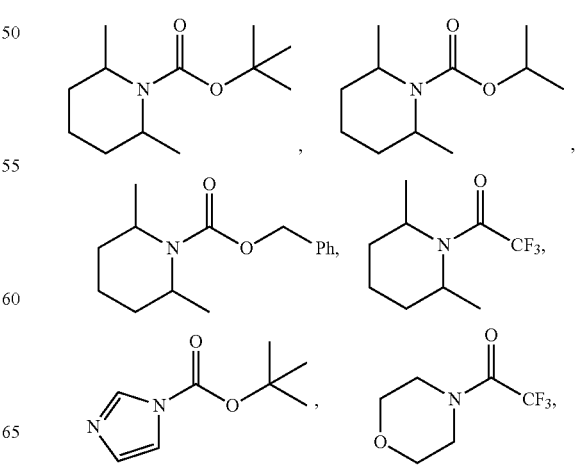

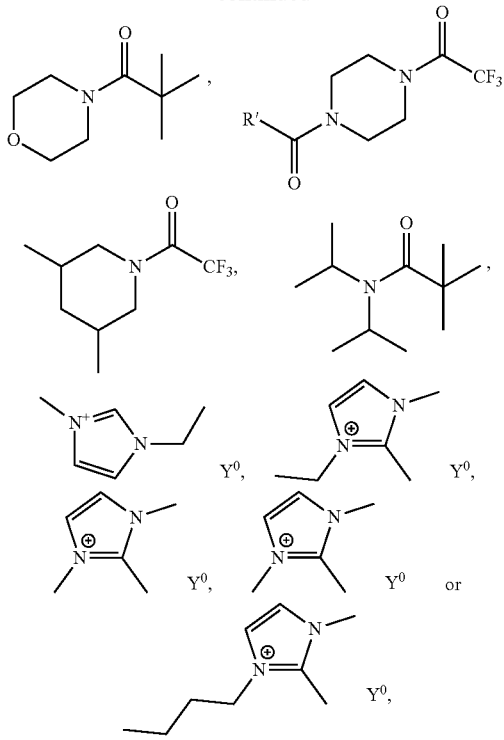

wherein $Y^0$ is an anionic group as described above.

In the polyimide precursor composition according to the present invention, the content of the thermal base generator is about 0.2 to about 20 parts by weight, preferably about 0.5 to about 10 parts by weight, and more preferably about 2 to 6 parts by weight, based on 100 parts by weight of the amic acid ester oligomer.

Moreover, an acidic environment can further facilitate the removal of the group D or E at the end of the amic acid ester oligomer of Formula (1) or (1'). However, if an acidic compound is directly added to the composition, it would lead to drawbacks such as reduced storage stability. Therefore, a photoacid generator may be optionally added to the polyimide precursor composition of the present invention. An acidic compound is released from the photoacid generator upon irradiation, to facilitate the removal of the group D or E, and then polymerization occurs. Thus, the photoacid generator is applicable to a development process by light sensing.

According to another embodiment of the present invention, the polyimide precursor composition of the present invention further comprises a photoacid generator, from which an acidic compound is released upon irradiation, thus providing an acidic environment to allow the groups D and E at the end of the amic acid ester oligomer of Formula (1) or (1') to be removed, followed by polymerization to form a larger polymer. Because related reactions occur upon irradiation, such compositions may be used as photosensitive polyimide precursor compositions and are described in detail below.

III. Photosensitive Polyimide Precursor Composition

According to an embodiment of the present invention, the polyimide precursor composition of the present invention is a photosensitive polyimide precursor composition comprising the above-mentioned amic acid ester oligomer of Formula (1) or (1'), a solvent, and a photoacid generator. By adding a photoacid generator, the amic acid ester oligomer of Formula (1) or (1') used in the present invention, optionally containing no photosensitive group (R*), is allowed to undergo a polymerization and ring-closing reaction, causing the difference between solubilities of the exposed and non-exposed regions. Therefore, the photosensitive polyimide precursor composition of the present invention can be directly used in an exposure and development process in the absence of any photosensitive group, and there is no problem with regard to affected physical properties of the polyimide caused by the residues of photosensitive groups.

The photoacid generator used in the present invention is decomposed upon irradiation to release an acidic compound, whereby a suitable acidic environment is provided, which facilitates the removal of the groups D and E at the end of the amic acid ester oligomer of Formula (1) or (1') and the polymerization of the amic acid ester oligomer into a polyimide. The photoacid generator may be any suitable conventional photoacid generator. The photoacid generator preferably has a pKa value not less than 6 before irradiation, and the compound released after irradiation has a pKa value less than 4. The photoacid generator is, for example, but not limited to, the following compounds or an analogue thereof:

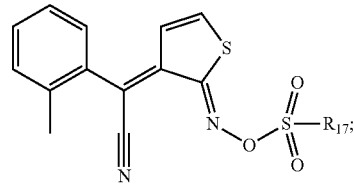

(11)

(12)

(13)

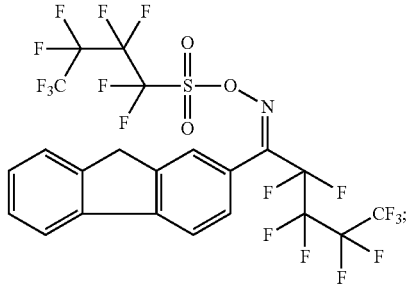

(14)

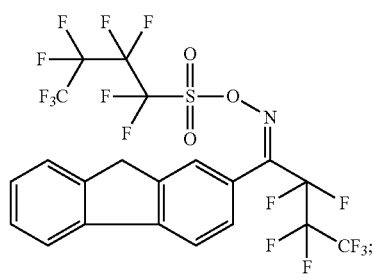

and a combination thereof;

where $R_{17}$ is $C_1$-$C_{10}$ alkyl, $C_6$-$C_{14}$ aralkyl unsubstituted or substituted with one or more $C_1$-$C_4$ alkyl, or

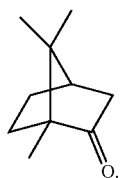

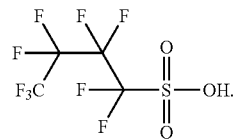

The products produced after irradiation of the compounds of Formulas (11) to (14) have a low boiling point, and can be removed conveniently, thus being particularly suitable for use as a photoacid generator in the present invention.

For example, the reaction scheme of the compound of Formula (11) being decomposed upon irradiation to release an acidic compound is as follows:

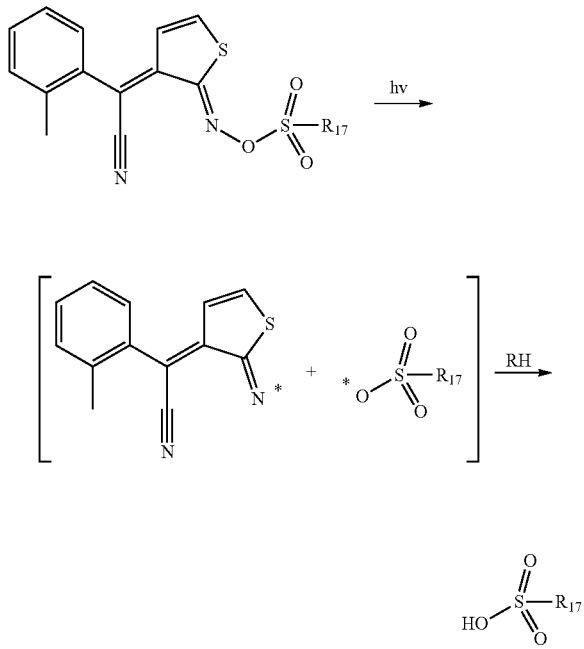

For example, the reaction scheme of the compound of Formula (14) being decomposed upon irradiation to release an acidic compound is as follows:

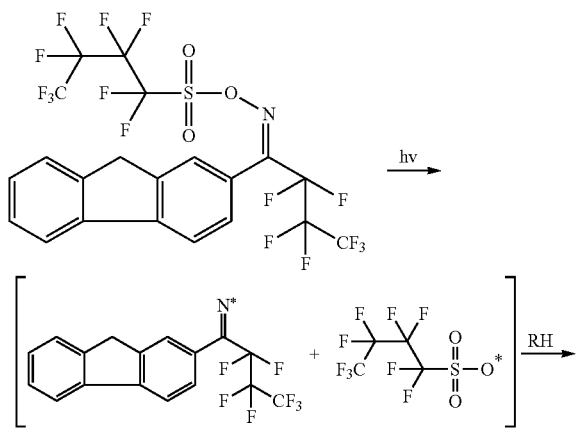

The solvent contained in the photosensitive polyimide precursor composition of the present invention may include a polar aprotic solvent that is preferably a type as described above.

In the photosensitive polyimide precursor composition according to the present invention, the content of the photoacid generator is about 0.5 to about 20 parts by weight and preferably about 2 to about 10 parts by weight, based on 100 parts by weight of the amic acid ester oligomer.

The photosensitive polyimide precursor composition according to the present invention may also optionally comprise any additive and/or thermal base generator known to those of ordinary skill in the art to which the present invention pertains for preparing the polyimides, in which the types of the additive and the thermal base generator are as described above.

According to another preferred embodiment of the present invention, the photosensitive polyimide precursor composition of the present invention comprises the above-mentioned amic acid ester oligomer of Formula (1) or (1'), a photoacid generator, and a thermal base generator. The photoacid generator can facilitate the development by light sensing, produce an acid upon irradiation such that the protecting group is removed, and promote the polymerization reaction. The addition of the thermal base generator can reduce the cyclization temperature, and further facilitate the subsequent ring-closing reaction for forming a polyimide. In a preferred embodiment of the present invention, the content of the photoacid generator is about 0.5 to about 20 parts by weight and preferably about 2 to about 10 parts by weight, and the content of the thermal base generator is about 0.5 to about 10 parts by weight and preferably about 2 to about 6 parts by weight, based on 100 parts by weight of the amic acid ester oligomer.

IV. Method for Preparing and Process for Patterning Polyimide

The present invention provides a polyimide prepared from the polyimide precursor composition or the photosensitive polyimide precursor composition as described above.

1. Preparation of Polyimide Through a Thermal Imidization Process or Chemical Imidization Process A polyimide can be prepared from the polyimide precursor composition of the present invention through a thermal imidization process or a chemical imidization process.

For example and without limitation, without being bound by any theory, when a thermal imidization process is adopted and the polyimide precursor composition of the present invention is used for preparing a polyimide, the possible reaction mechanism is as follows:

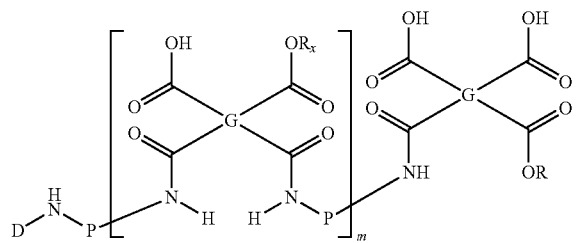

↓

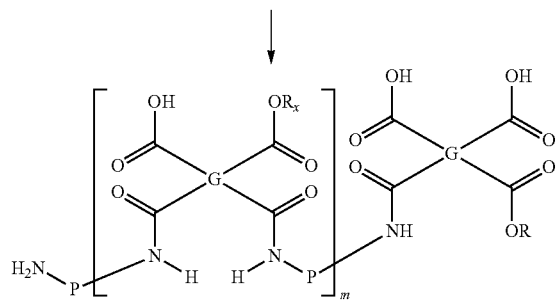

↓

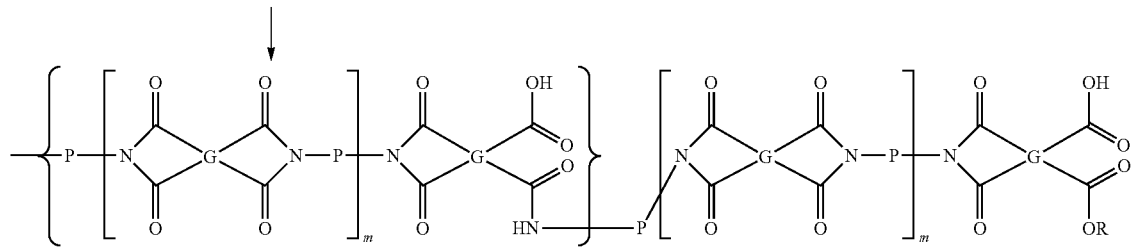

↓

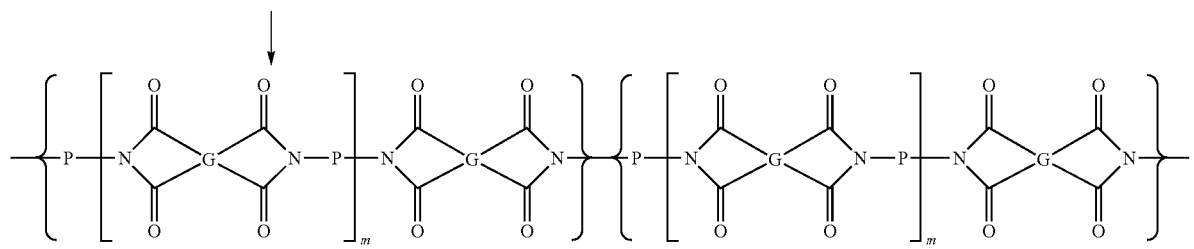

↓

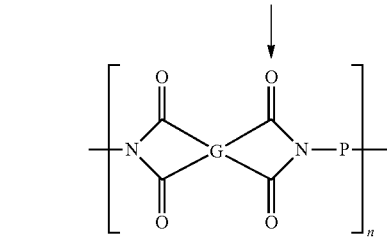

where m is as defined above and n is an integer of >500.

For example, in a thermal imidization process, the polyimide precursor composition of the present invention is heated at a ramping temperature of 5° C./min up to about 200° C., then kept for 1 hr, and further heated to 300° C. and kept for 2 hrs, to prepare a polyimide.

For example, in a chemical imidization process, the polyimide precursor composition containing a thermal base generator of the present invention is heated at a ramping temperature of 5° C./min up to about 200° C., then kept for 1 hr, and further heated to 250° C. and kept for 2 hrs, to prepare a polyimide.

2. Use of the Photosensitive Polyimide Precursor Composition of the Present Invention in a Patterning Process The photosensitive polyimide precursor composition of the present invention can be used in a patterning process, and the amic acid ester oligomer of Formula (1) or (1') is polymerized and cyclized into a polyimide after an irradiation and heating step.

Taking the photosensitive polyimide precursor composition containing a photoacid generator as an example, the method for preparing a polyimide comprises:

(I) exposure: irradiating the photosensitive polyimide precursor composition of the present invention to decompose the photoacid generator to release an acidic compound, thus providing an acidic environment;

(II) post-exposure baking: optionally heating (for 5-30 min at 25-150° C. and preferably 50-150° C.) in the acidic environment, to remove the group D or E on the terminal amino group of the amic acid ester oligomer of Formula (1) or (1'), followed by polymerization to form a larger polymer;

(III) developing, to remove the non-exposed region; and (IV) finally, cyclizing at a high temperature (at 250-350° C. for 0.5-3 hrs) and polymerizing to form a patterned polyimide.

By taking the amic acid ester oligomer of Formula (1) as an example, a possible reaction scheme of steps (II) to (IV) is as follows:

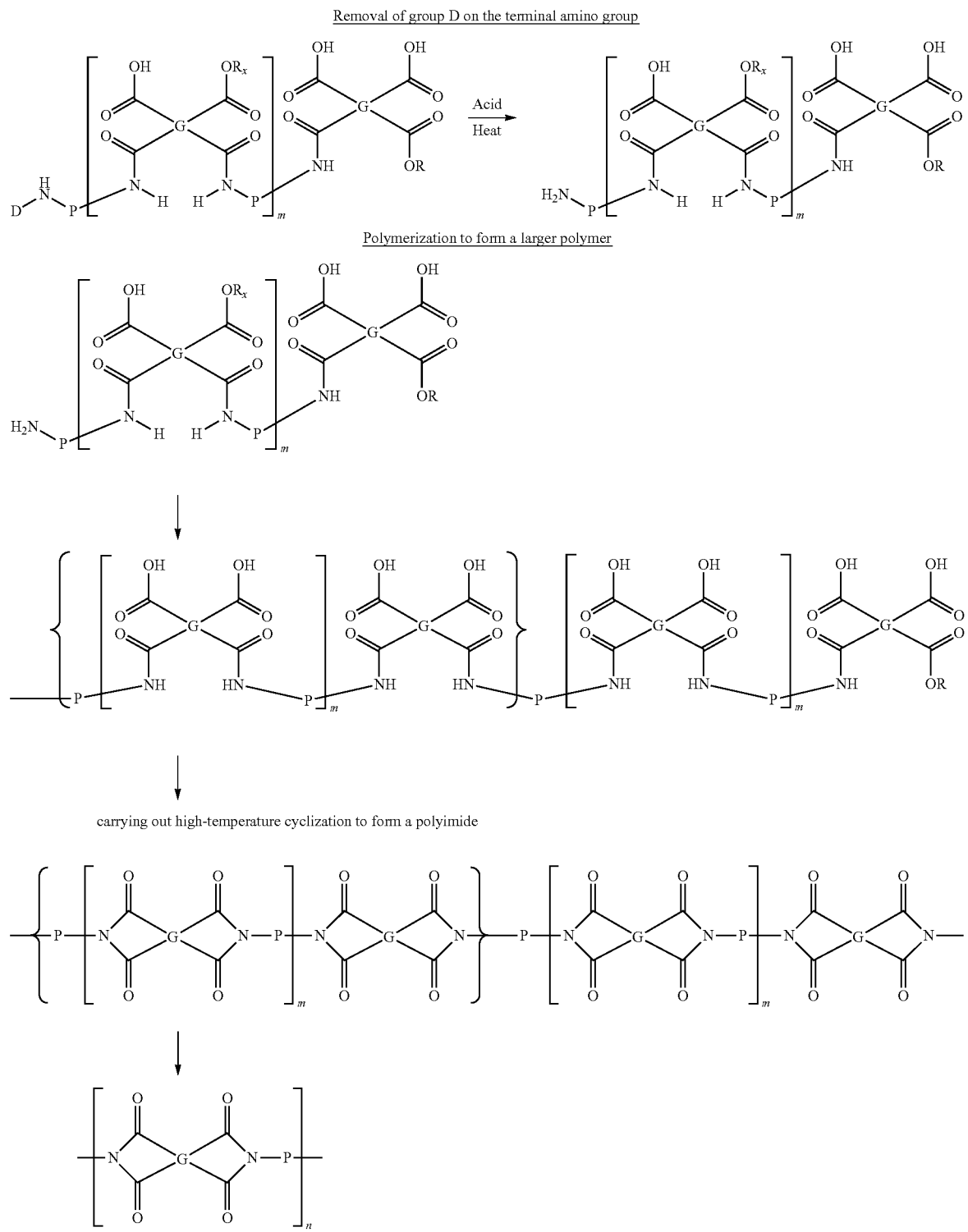

where m is as defined above and n is an integer greater than 500.

The photosensitive polyimide precursor composition of the present invention has photosensitivity due to the presence of a photoacid generator or a combination of a photoacid generator and a thermal base generator (low-temperature cyclization), and can be used in a photoresist, a buffer layer of a semiconductor, a redistribution layer of an IC package, and a coverlay, in place of the conventional photosensitive polyimide. The photoacid generator is decomposed upon irradiation to release an acidic compound, whereby a suitable acidic environment is provided, which facilitates the removal of the group D or E from the amic acid ester oligomer under a suitable temperature, and facilitates the polymerization of the amic acid ester oligomer into a larger polymer. The presence of a thermal base generator can further facilitate the ring closing and polymerization of the amic acid ester oligomer.

The photosensitive polyimide precursor composition of the present invention has photosensitivity. Due to the partial polymerization of the amic acid ester oligomer in the exposed region, there is a difference between the solubilities of the composition in the exposed and non-exposed regions after exposure, whereby the composition in the exposed region can be removed, leaving an intended pattern. Therefore, the photosensitive polyimide precursor composition of the present invention is particularly applicable to a patterning process. In addition, by virtue of the above features, a photoresist layer does not needed to be additionally applied when the photosensitive polyimide precursor composition of the present invention is used. Thus, the process steps can be reduced, the line deformation caused by removal of the photoresist layer in the conventional patterning process can be avoided, and the yield of the patterning process is improved.

For example and without limitation, the photosensitive polyimide precursor composition of the present invention can be coated onto, for example, a polyethylene terephthalate (PET) thin film. After being baked to form a film, it is transferred and laminated to a copper clad laminate, and then developed by exposure to obtain an intended pattern. And the amic acid ester oligomer is polymerized and imidized to prepare a polyimide coverlay with excellent performances.

The steps of coating and baking to form a film may be performed in a manner well known in the art, so are the transfer and lamination steps.

The exposure step may be performed in any manner known to a person of ordinary skill in the art, for example, by using UV light, visible light, electron beam or laser irradiation, and preferably UV light. Taking the photoacid generator as an example, in the exposure step, the photoacid generator in the exposed region is decomposed to release an acidic compound, thus providing an environment suitable for the removal of the protecting group D or E; then, a post-exposure baking step is optionally performed to raise the temperature, whereby the protecting group D or E on the terminal amino group of the amic acid ester oligomer of Formula (1) or (1') is removed. In such case, —NH$_2$ formed due to the removal of the protecting group can react with the other end (that is, the terminal ester group (—COOR) and carboxyl group (—COOH)), thereby effecting the polymerization.

An acid environment can facilitate the removal of the protecting group from the amic acid ester oligomer of Formula (1) or (1') according to the present invention and facilitate the occurrence of the polymerization reaction. Therefore, in the baking step after exposure, the protecting group will not be removed from the amic acid ester oligomer in the non-exposed region, and no polymerization reaction occurs. In addition, by means of the baking step after exposure, the interference in the vertical direction of the film and the majority of the solvent can be removed, and the partial imidization and polymerization reaction may also take place in this step. According to the present invention, the baking step after exposure is preferably carried out for about 5 to about 30 min on a heat plate or in an oven at about 70 to about 150° C.

Due to the occurrence of ring closing and polymerization to the amic acid ester oligomer in the exposed region after the baking step after exposure, there is a difference between the solubilities of the amic acid ester oligomer in the exposed region and the amic acid ester oligomer in the non-exposed region. Therefore, the non-exposed region can be removed by dissolving it through development, and then the remainder is rinsed with water to obtain an intended pattern. The developing agent used is one well known to a person of ordinary skill in the art. Examples of the developing agent include for example, but are not limited to, an aqueous K$_2$CO$_3$ solution, an aqueous Na$_2$CO$_3$ solution, an aqueous KOH solution, an aqueous NaOH solution, or an aqueous TMAH solution.

Finally, the patterned film is cured so that the remaining polyamic acid is imidized and cyclized to form a polyimide, and the solvent and products derived from the photoacid generator and the thermal base generator are removed. According to the present invention, the product generated after the decomposition of the photoacid generator used has a low boiling point that is preferably not higher than 250° C. and more preferably not higher than 225° C., such that the product can be removed at a low temperature. According to an embodiment of the present invention, the curing step comprises: baking in one stage or in multiple stages at a temperature of about 250 to about 350° C. for about 30 to about 180 min.

The following examples are provided for exemplifying the embodiments and illustrating the technical features of the present invention, and not intended to limit the scope of the present invention. Any changes or equivalent arrangements that may be readily achieved by persons skilled in the art are within the protection scope of the present invention as defined by the appended claims.

Preparation of Polyimide Precursor (Amic Acid Ester Oligomer) and Composition Containing the Same Example 1 (Amic Acid Ester Oligomer of Formula (1), where the Protecting Group D is

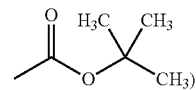

2.181 g (0.01 mol) pyromellitic dianhydride (referred to hereinafter as PMDA) was dissolved in 200 g N-methyl-2-pyrrolidinone (referred to hereinafter as NMP), and agitated for 2 hours at room temperature. 1.301 g (0.01 mol) 2-hydroxyethyl methacrylate (referred to hereinafter as HEMA) was slowly added dropwise, heated to 50° C., and agitated for reaction over 2 hours. Then, 10.8140 g (0.1 mol) para-phenylenediamine (referred to hereinafter as pPDA)

was added to the solution, and completely dissolved. Then, 19.6308 g (0.09 mol) PMDA was added, and agitated for reaction over 6 hours at a fixed temperature of 50° C. Finally, 2.1825 g (0.01 mol) di-tert-butyl dicarbonate (referred to hereinafter as BOC$_2$O) was added and agitated for 1 hour.

Example 2 (Amic Acid Ester Oligomer of Formula (1), where the Protecting Group D is

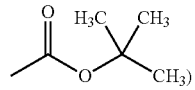

2.9422 g (0.01 mol) 4,4'-biphenyltetracarboxylic dianhydride (BPDA) was dissolved in 200 g NMP, heated to 50° C. and agitated for reaction over 2 hours. 0.6010 g isopropyl alcohol (referred to hereinafter as IPA) was slowly added dropwise, and agitated for reaction over 2 hours at a fixed temperature of 50° C. Then, 20.024 g (0.1 mol) 4,4'-diamino-diphenyl ether (ODA) was added to the solution, and completely dissolved. Then, 26.4798 g (0.09 mol) BPDA was added, and agitated for reaction over 6 hours at a fixed temperature of 50° C. Finally, 2.1825 g (0.01 mol) BOC$_2$O was added and agitated for 1 hour.

Example 3 (Amic Acid Ester Oligomer of Formula (1), where the Protecting Group D is

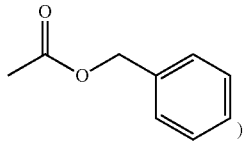

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.7059 g (0.01 mol) benzyl chloroformate (BC) was added and agitated for 1 hour, and then triethyl amine (Et$_3$N) was added (for neutralizing HCl produced after the reaction).

Example 4 (Amic Acid Ester Oligomer of Formula (1), where the Protecting Group D is

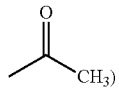

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.0209 g (0.01 mol) acetic anhydride (AA) was added and agitated for 1 hour.

Example 5 (Amic Acid Ester Oligomer of Formula (1), where the Protecting Group D is

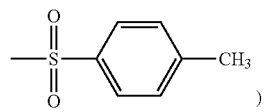

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.9065 g (0.01 mol) p-toluenesulfonyl chloride was added and agitated for 1 hour, and then triethyl amine (Et$_3$N) was added.

Example 6 (Amic Acid Ester Oligomer of Formula (1), where the Protecting Group D is

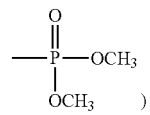

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.1005 g (0.01 mol) phosphorous acid dimethyl ester was added and agitated for 1 hour, and then triethyl amine (Et$_3$N) was added.

Example 7 (Amic Acid Ester Oligomer of Formula (1'), where the Protecting Group E is

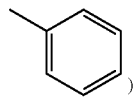

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.0814 g (0.01 mol) phenylmethanol was added and agitated for 24 hours.

Example 8 (Amic Acid Ester Oligomer of Formula (1), where the Protecting Group D is Ethyl)

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 0.4405 g (0.01 mol) acetaldehyde was added and agitated for 3 hours.

Example 9 (Amic Acid Ester Oligomer of Formula (1), where the Protecting Group D is

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 2.6475 g (0.01 mol) 1,1,1,3,3,3-hexachloropropan-2-one was added and agitated for 3 hours.

Example 10 (Amic Acid Ester Oligomer of Formula (1), where the Protecting Group D is

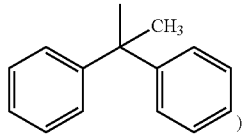

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 2.1671 g (0.01 mol) (1-chloroethane-1,1-diyl)dibenzene was added and agitated for 3 hours.

Example 11 (Amic Acid Ester Oligomer of Formula (1), where the Protecting Group D is

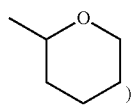

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 0.8412 g (0.01 mol) 3,4-dihydro-2H-pyran and 0.49 g (0.005 mol) phosphoric acid catalyst were added and agitated for 3 hours.

Example 12 (Amic Acid Ester Oligomer of Formula (1), where the Protecting Group D is

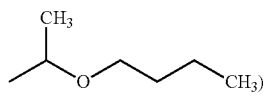

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.0016 g (0.01 mol) 1-(vinyloxy)butane was added and agitated for 1 hour.

Example 13 (Amic Acid Ester Oligomer of Formula (1), where the Protecting Group D is

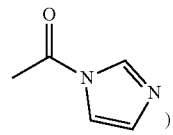

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.6205 g (0.01 mol) di(1H-imidazol-1-yl)methanone was added and agitated for 1 hour.

Example 14 (Amic Acid Ester Oligomer of Formula (1), where the Protecting Group D is

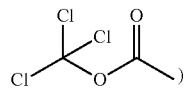

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.9783 g (0.01 mol) trichloromethyl chloroformate was added and agitated for 1 hour.

Example 15 (Amic Acid Ester Oligomer of Formula (1'), where the Protecting Group E is

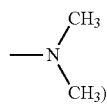

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 1.1916 g (0.01 mol) N,N-dimethylformamide dimethyl acetal was added and agitated for 24 hours.

Comparative Example 1 (No Protecting Group)

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C.

Comparative Example 2 (No Protecting Group)

2.9422 g (0.01 mol) 4,4'-biphenyltetracarboxylic dianhydride (BPDA) was dissolved in 200 g NMP, heated to 50° C. and agitated for reaction over 2 hours. 0.6010 g IPA was slowly added dropwise, and agitated for reaction over 2 hours at a fixed temperature of 50° C. Then, 20.024 g (0.1 mol) 4,4'-diamino-diphenyl ether (ODA) was added to the solution, and completely dissolved. Then, 26.4798 g (0.09 mol) BPDA was added, and agitated for reaction over 6 hours at a fixed temperature of 50° C.

Comparative Example 3 (the Protecting Group is

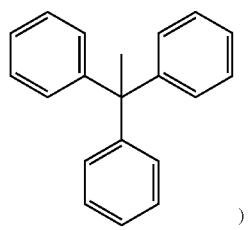 [SMILES: CC(c1ccccc1)(c1ccccc1)c1ccccc1]

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 2.7878 g (0.01 mol) trityl chloride and catalyst N,N-Dimethylpyridin-4-amine (referred to hereinafter as 4-DMAP) were added and agitated for 1 hour.

Comparative Example 4 (the Protecting Group is

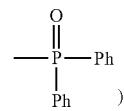

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 2.3663 g (0.01 mol) diphenylphosphinic chloride and catalyst 4-DMAP were added and agitated for 1 hour.

Comparative Example 5 (the Protecting Group is

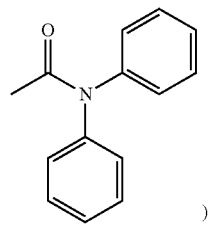 [SMILES: CC(=O)N(c1ccccc1)c1ccccc1]

2.181 g (0.01 mol) PMDA was dissolved in 200 g NMP, and agitated for 2 hrs at room temperature. 1.301 g (0.01 mol) HEMA was slowly added dropwise, heated to 50° C. and agitated for reaction over 2 hours. Then, 10.8140 g (0.1 mol) pPDA was added to the solution, and completely dissolved. Then, 19.6308 g (0.09 mol) PMDA was added, and agitated for reaction over 6 hours at a fixed temperature of 50° C. Finally, 2.3168 g (0.01 mol) diphenylcarbamoyl chloride and catalyst 4-DMAP were added and agitated for 1 hour.

Polyimide Precursor Composition Comprising a Thermal Base Generator and Preparation of Polyimide The polyimide precursor compositions prepared in the examples and comparative examples were respectively added with 0.20 g thermal base generator

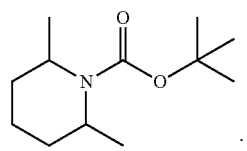

The individual polyimide precursor composition was evenly coated onto a copper clad laminate by a blade, and baked in an oven at a temperature ramping from room temperature to 150° C. within 35 min and maintained at 150° C. for 30 min in a first stage; and then ramping from 150 to 250° C. and maintained at 250° C. for 120 min in a second stage. After hard baking, the copper clad laminate was removed by etching to obtain a polyimide film.

Photosensitive Polyimide Precursor Composition

The polyimide precursor compositions prepared in the examples and comparative examples were respectively added with 0.2 g thermal base generator

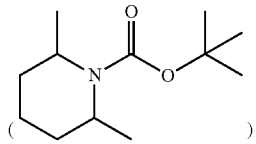

and 0.4 g photoacid generator

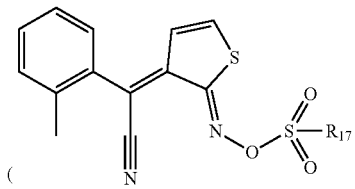

in which $R_{17}$ is

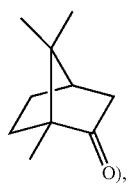

to obtain a photosensitive polyimide precursor composition.

Test Methods

Storage Stability:

The polyimide precursor compositions prepared in the examples and comparative examples were placed in an environment with a controlled temperature and humidity (25° C.; 55% RH). The change in the viscosity of the polyimide precursor composition at various storage time was measured by using the Brookfield viscometer, and the number of days when the viscosity is elevated or reduced to 50% of the initial viscosity was recorded.

Tensile Strength:

The tensile strength was a mechanical property of a polyimide film (after the copper clad laminate is removed) prepared with the polyimide precursor compositions prepared in the examples and comparative examples as measured according to the IPC-TM-650 (2.4.19) test method by using a universal tensile test machine.

Measurement of the Coefficient of Thermal Expansion (CTE) of the Polyimide Layer The CTE data of the polyimide film was measured by using a thermomechanical analyzer (TMA, a TA Q400 instrument manufactured by Texas Instruments Incorporated). The measurement range was between 0 and 500° C., and the temperature was increased at 10° C./min.

Thermal Degradation Test:

The $Td_{5\%}$ data of the polyimide film was measured by using a thermogravimetric analyzer (TMA, a TA Q5000 instrument manufactured by Texas Instruments Incorporated). The measurement range was between 0 and 600° C., and the temperature was increased at 10° C./min.

Photosensitivity Test:

The photosensitive polyimide precursor composition obtained in Example 1 was evenly coated onto a copper clad laminate substrate by using a spin coater. It was dried for 3-5 min in an oven at 90° C., then exposed to UV, and baked for 10-30 min in an oven at 120-150° C. The film thickness was about 20 m. The film was soaked in I wt % aqueous $K_2CO_3$ solution and developed to form a pattern. The film thicknesses of the exposed and non-exposed regions were measured after soaking for 30 seconds, and the solubility in the aqueous $K_2CO_3$ solution was calculated. The results are shown in Table 2.

<Test Results>

The related test results of the examples and comparative examples are shown in Tables 1-2.

TABLE 1

|  | Storage stability (days) | Tensile strength (MPa) | CTE (ppm/° C.) | Thermal degradaton (° C.) |
| --- | --- | --- | --- | --- |
| Example 1 | 14 | 290 | 1.8 | 605 |
| Example 2 | 15 | 245 | 28 | 530 |
| Example 3 | 26 | 285 | 2.2 | 590 |
| Example 4 | 16 | 201 | 1.1 | 510 |
| Example 5 | 22 | 225 | 2.6 | 535 |
| Example 6 | 23 | 210 | 2.1 | 540 |
| Example 7 | 23 | 265 | 2.8 | 577 |
| Example 8 | 20 | 242 | 1.3 | 510 |
| Example 9 | 25 | 231 | 1.1 | 502 |
| Example 10 | 25 | 220 | 1.2 | 490 |
| Example 11 | 20 | 259 | 1.2 | 525 |
| Example 12 | 18 | 215 | 1.3 | 515 |
| Example 13 | 30 | 265 | 1.1 | 530 |
| Example 14 | 25 | 215 | 1.1 | 505 |
| Example 15 | 15 | 250 | 1.4 | 530 |
| Comparative Example 1 | 10 | 293 | 2.1 | 615 |
| Comparative Example 2 | 10 | 235 | 26 | 550 |
| Comparative Example 3 | 12 | 191 | 14 | 491 |
| Comparative Example 4 | 21 | 176 | 8.7 | 436 |
| Comparative Example 4 | 23 | 155 | 11.6 | 409 |

It can be known from Table 1 that the polyimide precursor composition of the present invention has excellent storage stability, and the polyimide prepared with the polyimide precursor composition of the present invention has good tensile strength and high thermal degradation temperature as a whole. Moreover, the polyimide precursor composition of the present invention may be selected according to the practical area of application, so as to prepare a polyimide having a suitable coefficient of thermal expansion.

TABLE 2

| | Photosensitivity test | | | |
| --- | --- | --- | --- | --- |
| Example 1 | Film thickness before development (μm) | Film thickness after development (μm) | Development time (sec) | Dissolution rate (μm/min) |
| Exposed region | 10 | 9.3 | 27 | 1.56 |
| Non-exposed region | 10 | 0 | 27 | 22.22 |

It can be known from Table 2 that after development of the photosensitive polyimide precursor composition of the present invention, there is a significant difference between the solubilities of the composition in the exposed and non-exposed regions after exposure, whereby the composition in the non-exposed region can be removed, leaving an intended pattern. Therefore, the photosensitive polyimide precursor composition of the present invention is applicable to development by light sensing and to a patterning process, and can be used in a photoresist, a buffer layer of a semiconductor, a redistribution layer of an IC package and a coverlay, in place of the conventional photosensitive polyimide.

The above-described embodiments of the present invention are intended to be illustrative only. Numerous alternative embodiments may be devised by persons skilled in the art without departing from the scope of the following claims.

What is claimed is:

1. An amic acid ester oligomer, having a structure of Formula (1) or (1') below:

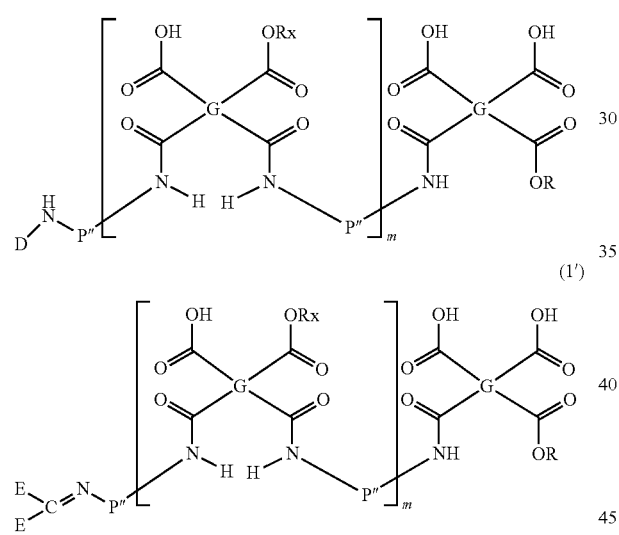

wherein

G is each independently a tetravalent organic group;

P''' is each independently a divalent organic group;

R is $C_1$-$C_{14}$ alkyl, $C_6$-$C_{14}$ aryl unsubstituted or substituted with one or more groups selected from the group consisting of hydroxyl and $C_1$-$C_4$ alkyl, or a group having an ethylenically unsaturated bond;

$R_x$ is each independently H, $C_1$-$C_8$ alkyl, or a group having an ethylenically unsaturated bond;

D is methyl, ethyl, propyl, butyl, or a group selected from the group consisting of:

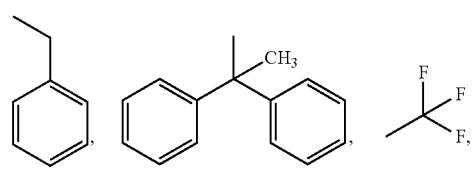

-continued

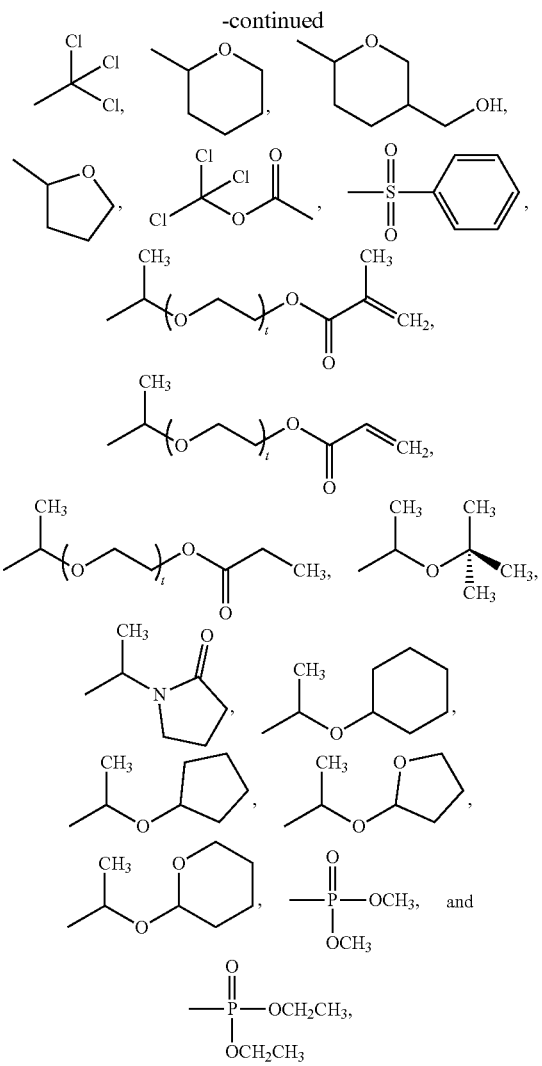

where t is an integer from 1 to 5;

two E are the same or different, and are each independently H, $C_1$-$C_{14}$ alkyl, alkylamino, alkylthio, $C_4$-$C_{10}$ cycloalkyl, $C_6$-$C_{14}$ aryl, nitrogen-containing heterocyclyl, oxygen-containing heterocyclyl, or

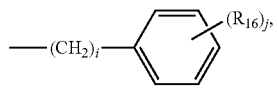

with the provision that two E attached to the same carbon atom are not H at the same time; or two E together with C=N— to which they are attached form

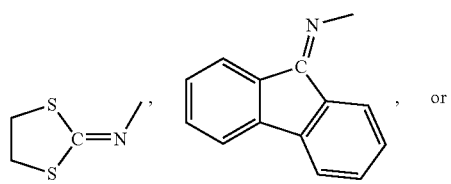

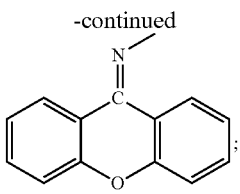

$R_{16}$ is each independently halo, hydroxyl, $C_1$-$C_8$ alkoxy, $C_1$-$C_8$ haloalkyl, or —$NO_2$;

i is an integer from 0 to 3;

j is an integer from 0 to 3; and m is an integer from 1 to 100.

2. The oligomer according to claim 1, wherein the group having an ethylenically unsaturated bond is selected from the group consisting of: ethenyl, propenyl, methylpropenyl, n-butenyl, iso-butenyl, ethenylphenyl, propenylphenyl, propenyloxymethyl, propenyloxyethyl, propenyloxypropyl, propenyloxybutyl, propenyloxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, and a group of Formula (2):

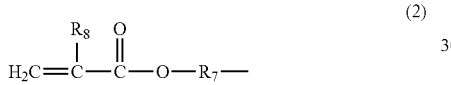 (2)

wherein $R_7$ is phenylene, $C_1$-$C_8$ alkylene, $C_2$-$C_8$ alkenylene, $C_3$-$C_8$ cycloalkylene, $C_1$-$C_8$ hydroxyalkylene or

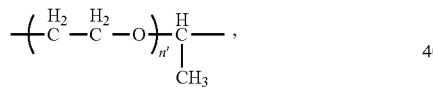

wherein n' is an integer from 1 to 4; and $R_8$ is hydrogen or $C_1$-$C_4$ alkyl.

3. The oligomer according to claim 1, wherein R is selected from the group consisting of:

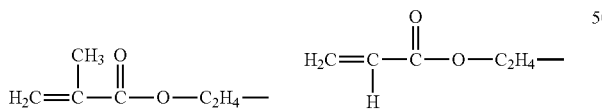

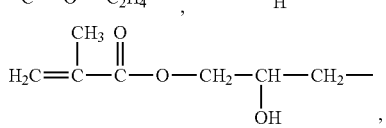

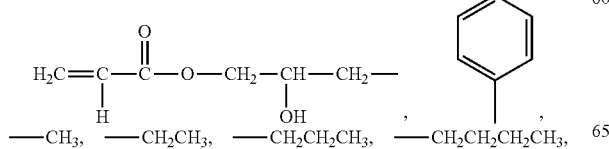

—$CH_3$, —$CH_2CH_3$, —$CH_2CH_2CH_3$, —$CH_2CH_2CH_2CH_3$,

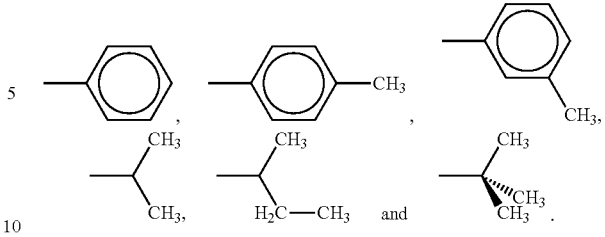

4. The oligomer according to claim 1, wherein the tetravalent organic group is each independently selected from the group consisting of:

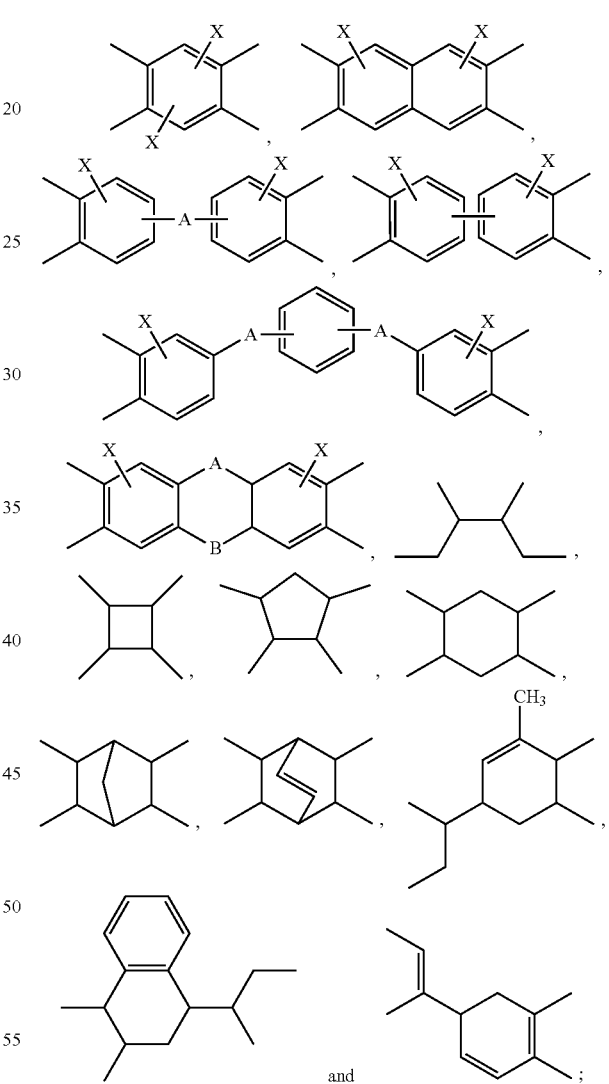

wherein X is each independently hydrogen, halo, $C_1$-$C_4$ perfluoroalkyl, or $C_1$-$C_4$ alkyl; and A and B at each occurrence are each independently a covalent bond, $C_1$-$C_4$ alkylene unsubstituted or substituted with one or more groups selected from hydroxyl and $C_1$-$C_4$ alkyl, $C_1$-$C_4$ perfluoroalkylene, $C_1$-$C_4$ alkyleneoxy, silylene, —O—, —S—, —C(O)—, —OC(O)—, —S(O)$_2$—, —C(=O)O—($C_1$-$C_4$ alkylene)-OC(=O)—, —CONH—, phenyl, biphenylyl, or

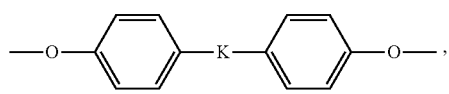
wherein K is —O—, —S(O)₂—, C₁-C₄ alkylene or C₁-C₄ perfluoroalkylene.
5. The oligomer according to claim 1, wherein the tetravalent organic group is each independently selected from the group consisting of:
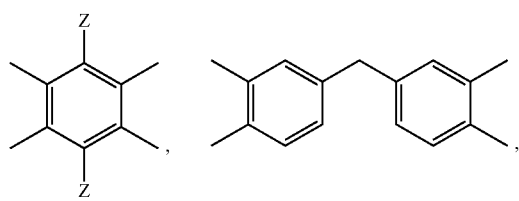
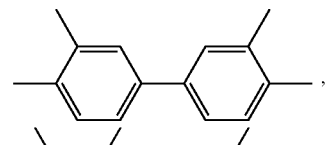
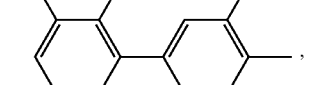
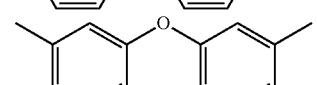
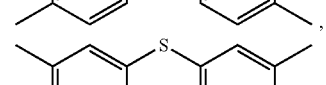
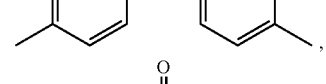
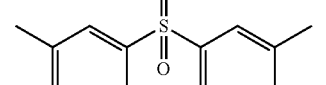
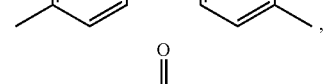
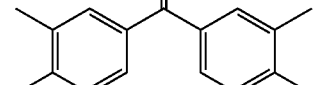
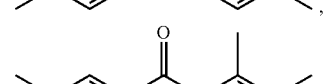
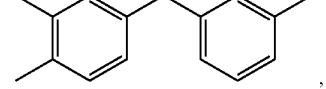
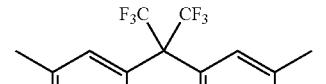
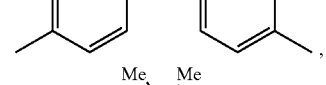
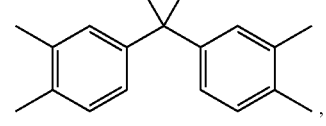
-continued
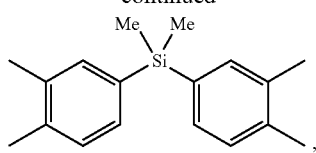
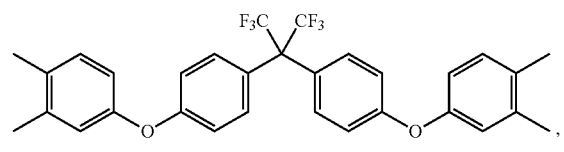
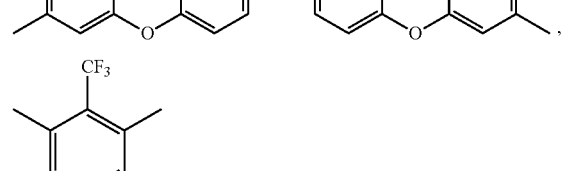
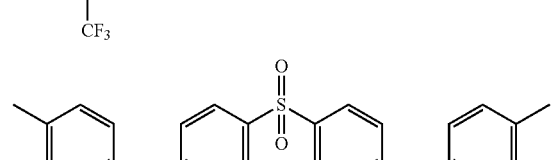
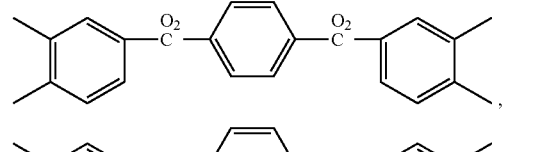
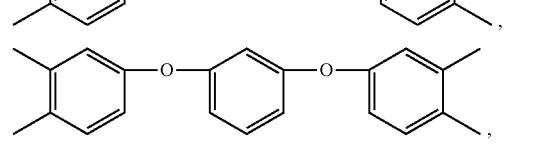
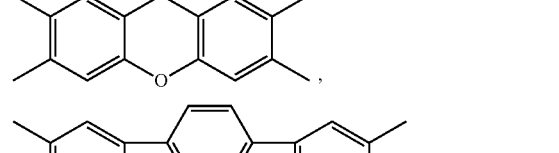
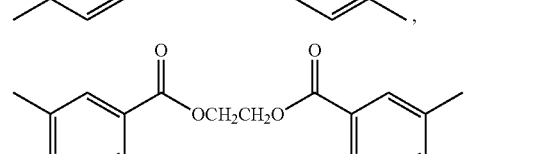
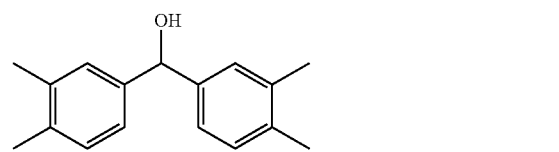

-continued

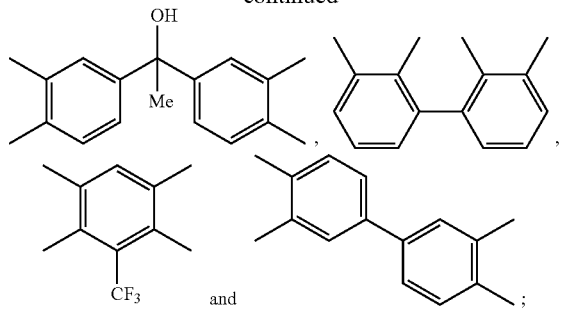

wherein Z is each independently hydrogen, methyl, trifluoromethyl or halo.

6. The oligomer according to claim 1, wherein the divalent organic group is each independently selected from the group consisting of:

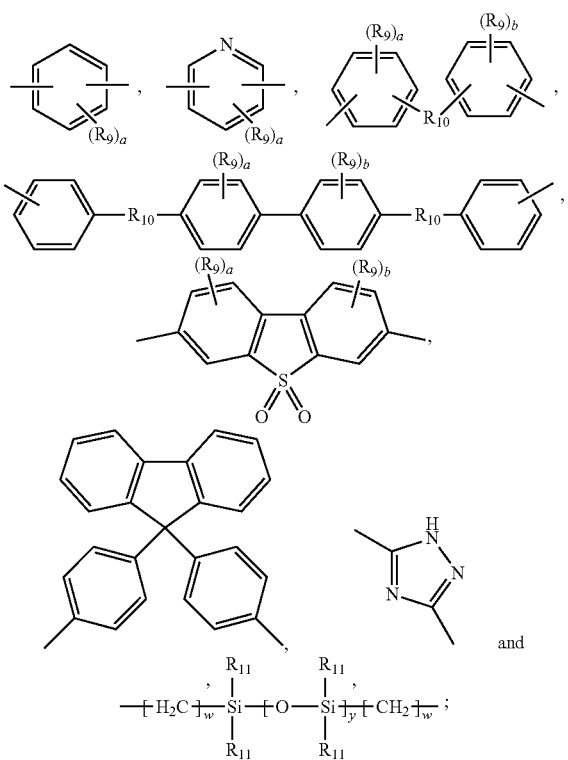

wherein:
$R_9$ is each independently H, $C_1$-$C_4$ alkyl, $C_1$-$C_4$ perfluoroalkyl, $C_1$-$C_4$ alkoxy, halo, —OH, —COOH, —NH$_2$ or —SH;
a is each independently an integer from 0 to 4;
b is each independently an integer from 0 to 4; and
$R_{10}$ is a covalent bond or a group selected from the group consisting of:

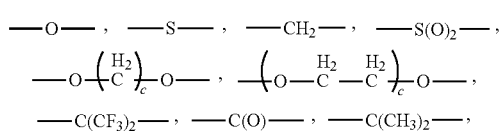

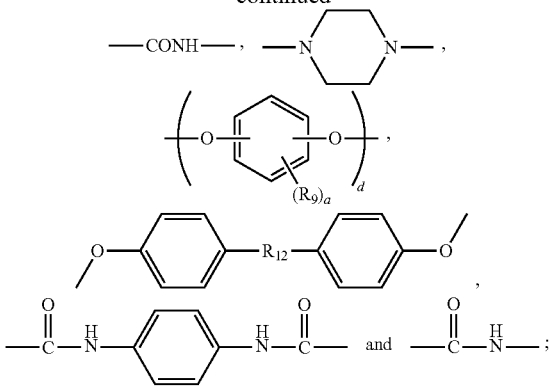

wherein
c and d are each independently an integer from 1 to 20;
$R_9$ and a are as defined above;
$R_{12}$ is —S(O)$_2$—, —C(O)—, a covalent group, $C_1$-$C_4$ alkyl or $C_1$-$C_4$ perfluoroalkyl;
$R_{11}$ is each independently hydrogen, halo, phenyl, $C_1$-$C_4$ alkyl, or $C_1$-$C_4$ perfluoroalkyl; and
w and y are each an integer from 1 to 3.

7. The oligomer according to claim 6, wherein the divalent organic group is each independently selected from the group consisting of:

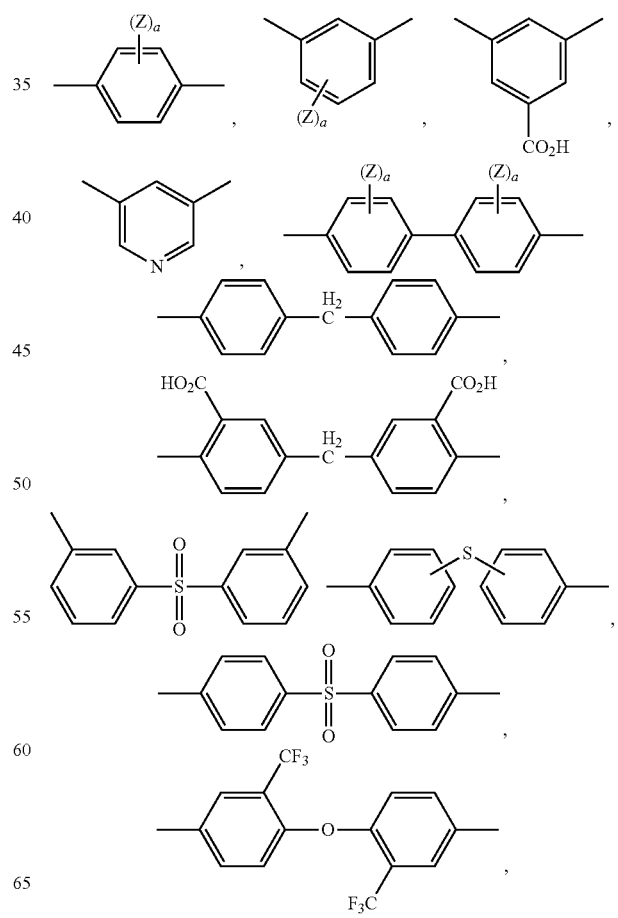

-continued
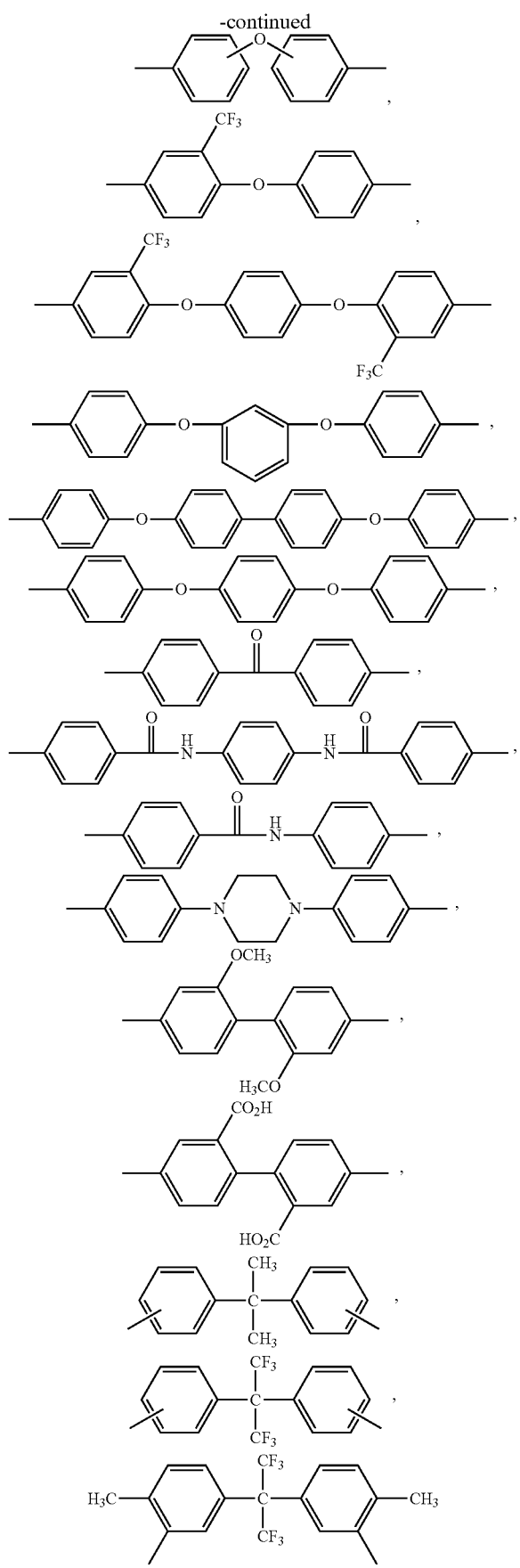
-continued
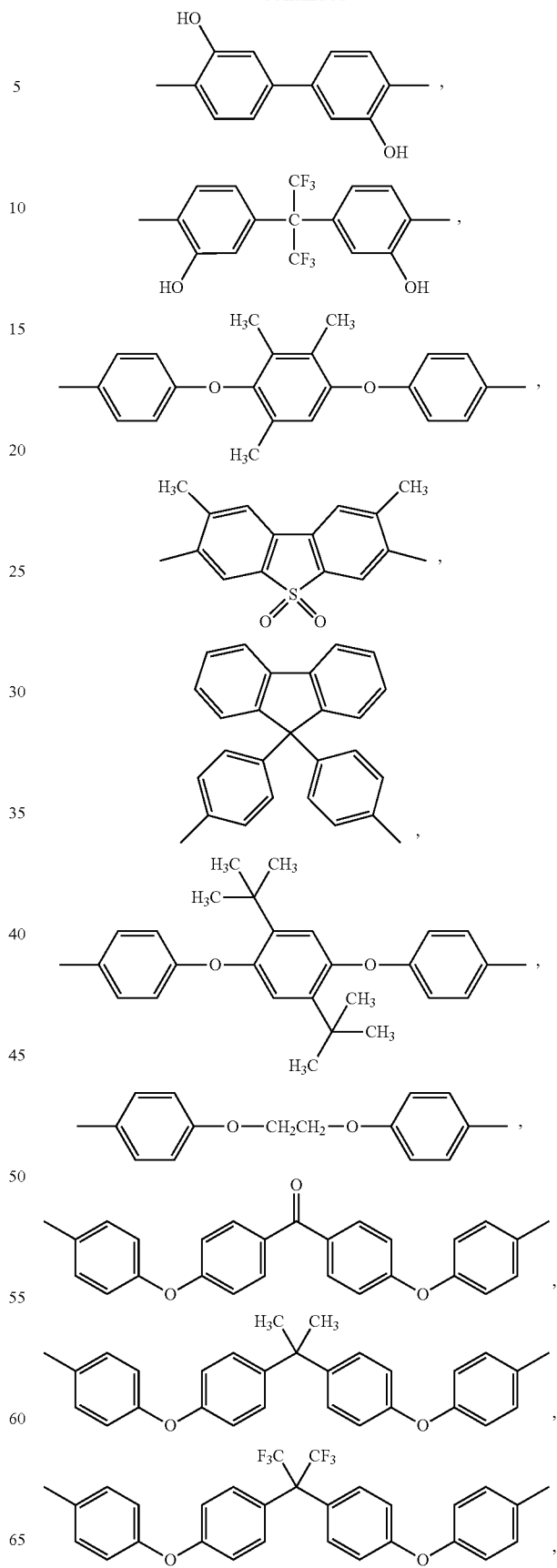

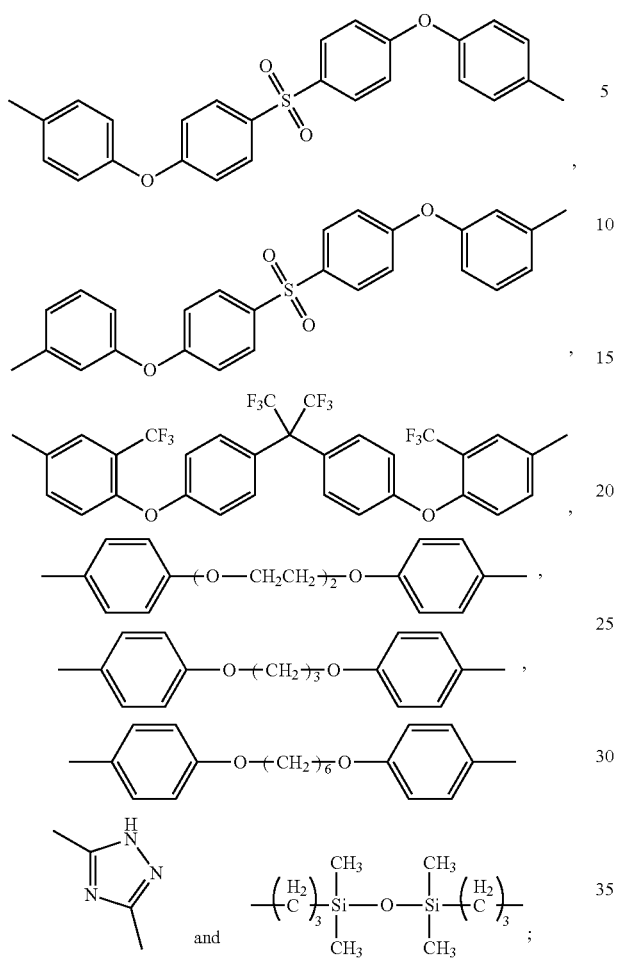

wherein:

a is each independently an integer from 0 to 4; and

Z is each independently hydrogen, methyl, trifluoromethyl or halo.

8. The oligomer according to claim 1, wherein the two E are each independently H, phenyl,

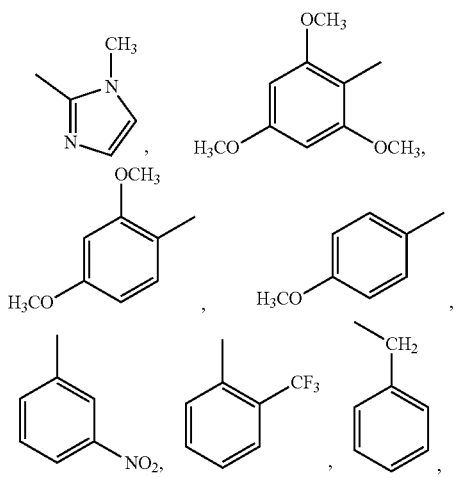

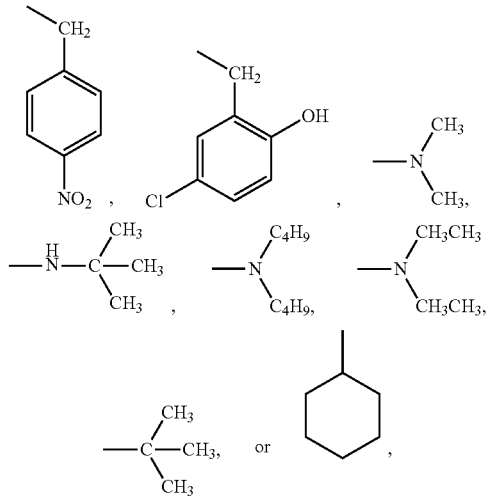

with the provision that two E are not H at the same time;

or the two E together with C=N— to which they are attached form

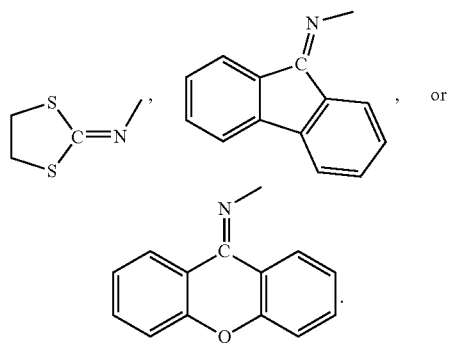

9. The oligomer according to claim 1, wherein m is an integer from 2 to 25.

10. A polyimide precursor composition, comprising an oligomer according to claim 1 and a solvent.

11. The composition according to claim 10, wherein the solvent is selected from the group consisting of dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol methyl ether, tetraethylene glycol dimethyl ether, diethylene glycol dibutyl ether, methanol, ethanol, butanol, butylcellosolve, γ-butyrolactone, xylene, toluene, hexamethylphosphoramide, propylene glycol methyl ether acetate,

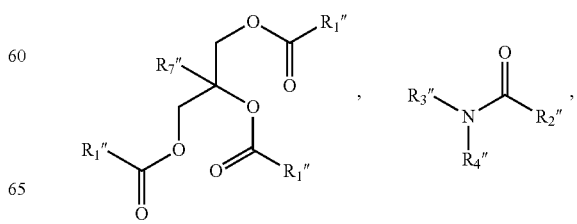

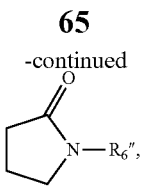

and a mixture thereof;

wherein $R_1''$ is each independently H, $C_1$-$C_{20}$ alkyl, $C_2$-$C_{20}$ alkenyl, or $C_2$-$C_{20}$ alkynyl;

$R_7''$ is H or $C_1$-$C_3$ alkyl;

$R_2''$ is H, $C_1$-$C_{15}$ alkyl, or $C_4$-$C_8$ cycloalkyl;

$R_3''$ and $R_4''$ are each independently $C_1$-$C_{10}$ alkyl, or $R_3''$ and $R_4''$ form, together with the nitrogen atom to which they are attached, a 5- to 6-membered heterocyclic ring; and $R_6''$ is $C_1$-$C_{15}$ alkyl, $C_2$-$C_{20}$ alkenyl, or $C_4$-$C_8$ cycloalkyl.

12. The composition according to claim 10 or 11, further comprising a thermal base generator.

13. The composition according to claim 10, wherein the polyimide precursor composition is a photosensitive polyimide precursor composition.

14. The composition according to claim 13, further comprising a photoacid generator, wherein the photoacid generator is selected from the group consisting of:

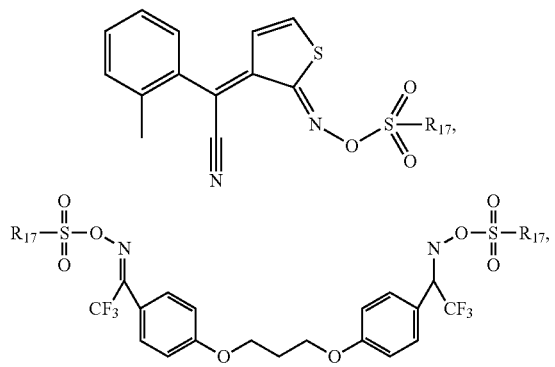

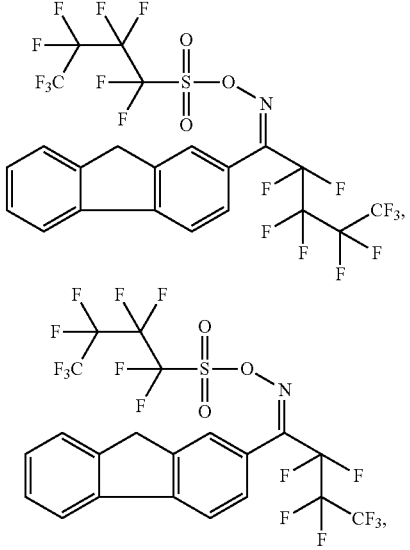

and a combination thereof;

wherein $R_{17}$ is $C_1$-$C_{10}$ alkyl, $C_6$-$C_{14}$ aralkyl unsubstituted or substituted with one or more $C_1$-$C_4$ alkyl, or

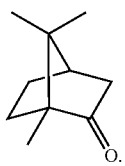

15. The composition according to claim 13, wherein based on 100 parts by weight of the amic acid ester oligomer, the content of the photoacid generator is about 0.5 to about 20 parts by weight.

16. The composition according to claim 13, further comprising a thermal base generator.

17. A polyimide prepared with the precursor composition according to claim 10.

18. A polyimide prepared with the oligomer according to claim 1.

* * * * *